(12) United States Patent
Taniguchi et al.

(10) Patent No.: US 12,032,194 B2
(45) Date of Patent: Jul. 9, 2024

(54) ILLUMINATION DISPLAY PANEL AND METHOD OF MANUFACTURING THE SAME

(71) Applicant: NISSHA CO., LTD., Kyoto (JP)

(72) Inventors: Chuzo Taniguchi, Kyoko (JP); Ryomei Omote, Kyoko (JP); Junichi Shibata, Kyoko (JP); Jun Sasaki, Kyoko (JP); Yoshihiro Sakata, Kyoko (JP); Toshifumi Kurosaki, Kyoko (JP); Shohei Morimoto, Kyoko (JP)

(73) Assignee: NISSHA CO., LTD., Kyoto (JP)

( * ) Notice: Subject to any disclaimer, the term of this patent is extended or adjusted under 35 U.S.C. 154(b) by 336 days.

(21) Appl. No.: 17/754,387

(22) PCT Filed: Aug. 17, 2020

(86) PCT No.: PCT/JP2020/031023
§ 371 (c)(1),
(2) Date: Mar. 31, 2022

(87) PCT Pub. No.: WO2021/079594
PCT Pub. Date: Apr. 29, 2021

(65) Prior Publication Data
US 2022/0252778 A1 Aug. 11, 2022

Related U.S. Application Data

(63) Continuation of application No. PCT/JP2020/031023, filed on Aug. 17, 2020.

(30) Foreign Application Priority Data

Oct. 23, 2019 (JP) .................................. 2019-193031

(51) Int. Cl.
*F21V 8/00* (2006.01)
*B29C 45/14* (2006.01)
(Continued)

(52) U.S. Cl.
CPC ...... *G02B 6/0021* (2013.01); *B29C 45/14688* (2013.01); *B29C 45/1671* (2013.01);
(Continued)

(58) Field of Classification Search
CPC .. G02B 6/0021; G02B 6/0065; H10K 50/858; H10K 50/844; H10K 71/00;
(Continued)

(56) References Cited

U.S. PATENT DOCUMENTS

2017/0301268 A1* 10/2017 Laforce ................. G09F 13/005

FOREIGN PATENT DOCUMENTS

| JP | H8171093 A | 7/1996 |
|---|---|---|
| JP | H10116044 A | 5/1998 |

(Continued)

*Primary Examiner* — Mary Ellen Bowman
(74) *Attorney, Agent, or Firm* — Alleman Hall & Tuttle LLP

(57) ABSTRACT

An illumination display panel that forms part of a housing and has a display portion for illuminated display comprises a resin panel having a first molded portion made of an opaque resin at a portion excluding the display portion, and a second molded portion disposed on the back surface side of the first molded portion and made of a light-transmitting resin having a protrusion where the first molded portion is not present. The protrusion is fitted to the first molded portion. A light source mounting substrate is disposed on the back surface side of the resin panel. At least a light source of the light source mounting substrate is sealed by the second molded portion. An integrally molded product of the light source mounting substrate and the second molded portion is filled and solidified at a low pressure while compressing a cavity of a molding mold.

14 Claims, 32 Drawing Sheets

(51) Int. Cl.
  *B29C 45/16*    (2006.01)
  *B29L 31/34*    (2006.01)
  *H01L 25/075*   (2006.01)
  *H01L 25/16*    (2023.01)
  *H01L 33/54*    (2010.01)
  *H10K 50/844*   (2023.01)
  *H10K 50/858*   (2023.01)
  *H10K 71/00*    (2023.01)
  *H10K 102/00*   (2023.01)

(52) U.S. Cl.
  CPC ........ *G02B 6/0065* (2013.01); *H01L 25/0753* (2013.01); *H01L 33/54* (2013.01); *H10K 50/844* (2023.02); *H10K 50/858* (2023.02); *H10K 71/00* (2023.02); *B29K 2995/0025* (2013.01); *B29K 2995/0026* (2013.01); *B29L 2031/3475* (2013.01); *G02B 6/0068* (2013.01); *G02B 6/0073* (2013.01); *H01L 25/167* (2013.01); *H01L 2933/005* (2013.01); *H10K 2102/351* (2023.02)

(58) Field of Classification Search
  CPC .......... B29C 45/14688; B29C 45/1671; H01L 25/0753; H01L 33/54
  See application file for complete search history.

(56) References Cited

FOREIGN PATENT DOCUMENTS

| | | |
|---|---|---|
| JP | 2001009863 A | 1/2001 |
| JP | 2010125647 A | 6/2010 |
| JP | 2018101576 A | 6/2018 |

* cited by examiner

ILLUMINATION DISPLAY PANEL AND METHOD OF MANUFACTURING THE SAME

TECHNICAL FIELD

The present invention relates to an illumination display panel, which is used for, for example, a vehicle, a home appliance, or an audio device, that performs display by introducing light from a light source, such as a light-emitting diode (an LED), and a method of manufacturing the same.

BACKGROUND ART

In related art, as an illumination display panel including a light source, such as an LED, on a back surface thereof and used for, for example, a vehicle, a home appliance, or an audio device, there has been an illumination display panel described in Patent Document 1 provided with a decorative layer by, for example, printing on a surface of a resin panel. The resin panel and the decorative layer have transmissive portions, and by disposing a light source on a back surface side of them, flashing of the light source is recognized from a front surface side of the illumination display panel.

When the light source is disposed facing the transmissive portions of the resin panel and the decorative layer, a shape of the light source is seen from the front surface side of the illumination display panel through the transmissive portions, or as many light sources need to be disposed as the number of transmissive portions. Therefore, Patent Document 1 also discloses that the light source is disposed on a portion other than the transmissive portions on the back surface side, and the light from the light source is totally reflected up to the transmissive portions and guided.

CITATION LIST

Patent Literature

Patent Document 1: JP 10-116044 A

SUMMARY OF INVENTION

Technical Problem

However, the known illumination display panel includes the light source in a space on the back surface side of the resin panel, and an air layer is present between the resin panel and the light source. Therefore, the light irradiated from the light source was partially reflected by an air layer interface at the resin panel, and the light was not able to efficiently exit from the illumination display panel.

In addition, since the light source is disposed in the space on the back surface side of the resin panel, the entire illumination display panel thickens. This caused a problem in which the empty space on the back surface side of the resin panel was not able to be widely used.

Furthermore, to assemble the illumination display panel to, for example, a device, the light source and the resin panel needed to be assembled in different steps, which was troublesome.

Accordingly, an object of the present invention is to provide an illumination display panel that ensures good light guiding efficiency and space-saving and simplifies an assembly step and a method of manufacturing the same.

Solution to Problem

Some aspects will be described below as means to solve the problems. These aspects can be combined arbitrarily as necessary.

An illumination display panel according to the present invention includes a display portion that is displayable in illumination and constitutes a portion of a housing.

The illumination display panel includes a resin panel including a first molded portion and a second molded portion and a light source mounting substrate.

The first molded portion of the resin panel is present at a portion excluding the display portion. The second molded portion of the resin panel is disposed on a back surface side of the first molded portion. The second molded portion includes a protrusion fitted with the first molded portion at a portion where the first molded portion is absent. The second molded portion is made of a light-transmitting resin that transmits light guided to the display portion. The first molded portion is made of an opaque resin having a transmittance of light lower than a transmittance of light of the second molded portion.

The light source mounting substrate includes a light source and a film substrate. The light source is disposed on a back surface side of the resin panel. Light from the light source is guided to the display portion. The light source is mounted on the film substrate. At least the light source of the light source mounting substrate is sealed with the second molded portion.

According to these configurations, the light irradiated from the light source passes through an inside of the second molded portion that functions as a light guide plate (a light guide) without passing through an air layer, passes through the display portion, and is emitted upward of a resin panel. That is, since there is no reflection by an air layer interface, the light irradiated from the light source can efficiently exit from the illumination display panel.

In addition, since the light source of the light source mounting substrate is built into the resin panel, space saving of a space occupied by an entire illumination display panel can be achieved.

Furthermore, since the resin panel and the light source mounting substrate are integrated, the number of components is reduced, and an assembly process of the illumination display panel to, for example, a device is simplified.

In addition, the second molded portion made of the light-transmitting resin of the resin panel is disposed on the back surface side of the first molded portion made of the opaque resin, and has the protrusion fitted with the first molded portion at the portion where the first molded portion is absent. Therefore, even without a decorative layer on a front surface of the resin panel, display in illumination can be performed with the first molded portion as a molded article made of the opaque resin. Therefore, as in the decorative layer, a light leakage caused by, for example, peeling over time or due to wear, does not occur.

Note that since the illumination display panel constitutes a part of the housing, a shape of the resin panel is complicated in some cases. The display in illumination can be performed without the decorative layer on the front surface of such a resin panel, which is extremely excellent in terms of the process.

In addition, since the light source mounting substrate is disposed on the back surface side of the resin panel and at least the light source of the light source mounting substrate is sealed by the second molded portion, which functions as the light guide plate, the light source mounting substrate is located on the back surface side rather than the front surface side of the second molded portion. In other words, the first molded portion, the second molded portion, and the light source mounting substrate are layered in this order from the front surface. Thus, in a case where the opaque resin constituting the first molded portion is a resin only having the transmittance of the light irradiated from the light source lower than a transmittance of light of the light-transmitting resin, and not having a function of completely shutting off light, that is, even in a case in which the light is weakly exited in the first molded portion, the substrate of the light source mounting substrate does not block the weak light exit in the first molded portion. That is, compared with a case where the light source mounting substrate is located on a front surface side of the second molded portion, a degree of freedom of decoration of the illumination display panel is high.

Preferred aspects of the illumination display panel according to the present invention will be described below.

As one aspect, a thickness of a light-guiding path portion in the second molded portion is from 0.2 mm to 1.0 mm. The light-guiding path portion is covered with the first molded portion and guides light to the display portion.

According to this configuration, the illumination display panel can be made thinner due to the thin wall thickness of the light guide path portion. Therefore, when the illumination display panel is assembled to, for example, the device, a housing space of other components behind the illumination display panel can be increased.

As one aspect, a portion where the first molded portion is absent is preferably a through-hole. The protrusion of the second molded portion is preferably fitted with an inner wall surface of the through-hole.

According to this configuration, for example, a character, a logo, and an image can be displayed so as to be bright on a dark background.

As one aspect, the protrusion of the second molded portion is preferably fitted with a side surface of the first molded portion.

According to this configuration, for example, a character, a logo, and an image can be displayed so as to be light-shielded in a bright background.

As one aspect, the protrusion of the second molded portion preferably has fine irregularities in a front surface.

According to this configuration, for example, a decorative function, such as matte, and an optical function, such as diffusion effect or lens effect, can be provided to the display portion.

As one aspect, a decorative layer that decorates a front surface of the resin panel is preferably further provided.

According to this configuration, in a portion other than the display portion where the display in illumination can be performed as well, a degree of freedom of design is higher than decoration with a monochromatic opaque color exhibited by the first molded portion, and therefore a complex shape, multi-colors, and a variety of patterns can be implemented.

A method of manufacturing the illumination display panel according to the present invention includes the following steps.

First, the light source mounting substrate is set to an upper mold of a low-pressure molding mold such that a mounted surface of the light source faces downward.

Next, a measured light-transmitting resin material is injected into a cavity provided with a lower mold of the low-pressure molding mold.

Next, after clamping the low-pressure molding mold, the light-transmitting resin material is filled and solidified at a low pressure while the cavity is compressed to integrate the second molded portion with the light source mounting substrate such that at least the light source is sealed with the second molded portion simultaneously with molding of the second molded portion.

Next, an integrally molded product of the light source mounting substrate and the second molded portion is set inside an insert molding mold such that the second molded portion side faces a cavity.

Finally, after the insert molding mold is clamped, an opaque resin material made of a thermoplastic resin in a molten state is injected into and filled in the cavity of the insert molding mold and the opaque resin material is solidified to integrate the first molded portion with the integrally molded product of the light source mounting substrate and the second molded portion simultaneously with molding of the first molded portion.

With the use of an injection molding method, which has been generally known as a resin molding method, a molten resin is injected into a cavity at high-speed and high-pressure with a screw. Therefore, when the light source mounting substrate is attempted to be integrated with the second molded portion simultaneously with the molding of the second molded portion, a problem, such as the light source of the light source mounting substrate being damaged or moving due to a resin pressure, occurs.

In contrast to this, according to the configuration, when the second molded portion is integrated with the light source mounting substrate simultaneously with the molding of the second molded portion, since the light-transmitting resin material is filled while the cavity is compressed, even when the resin pressure inside the cavity is not high, the light-transmitting resin material can be sufficiently flowed, thereby reaching the light-transmitting resin material up to corners in the cavity. Thus, the light source can be sealed without causing damage or movement of the light source during the molding of the second molded portion.

Furthermore, the flow of the light-transmitting resin material by compression reaching the light-transmitting resin material up to the corners in the cavity even when the second molded portion has a thin wall. This allows preventing a defect of having an incomplete filled portion in a portion of the second molded portion. In the second molded portion, this is particularly effective in the light guide path portion, which is located behind the first molded portion and guides light to the display portion, because the light guide path portion has an extremely thin wall.

To describe further, a degree of freedom of selection of the thicknesses of the light source and other electronic components mounted on the light source mounting substrate is high. In other words, selecting a thin electronic component that is less susceptible to the resin pressure during molding of the second molded portion is unnecessary. Furthermore, to be less susceptible to the resin pressure during molding of the second molded portion, separately protecting and reinforcing (fixing) the electronic component by means, such as a potting, is unnecessary.

In addition, the manufacturing method of illumination display panel according to the present invention need not perform insert molding using the integrally molded product of the light source mounting substrate and the second molded portion after the second molded portion is integrated with the light source mounting substrate.

For example, the separately molded first molded portion may be laminated on the integrally molded product of the light source mounting substrate and the second molded portion.

Further, the manufacturing method of the illumination display panel according to the present invention may simultaneously integrate the second molded portion with the light source mounting substrate and the first molded portion.

In other words, before injecting the light-transmitting resin material, the separately molded first molded portion is set in the cavity provided with the lower mold of the low-pressure molding mold.

Note that in each of the manufacturing methods described above, the low-pressure molding mold is preferably a compression molding mold. After injecting the light-transmitting resin material made of an uncured thermosetting resin into the cavity provided with the heated lower mold, the low-pressure molding mold is preferably clamped.

Additionally, in each of the manufacturing methods described above, the low-pressure molding mold may be an injection press molding mold. After clamping the low-pressure molding mold, the light-transmitting resin material made of a thermoplastic resin in a molten state may be injected into the cavity provided with the lower mold.

As one aspect, the lower mold of the low-pressure molding mold preferably has fine irregularities in a portion corresponding to a front surface of the protrusion of the second molded portion.

According to this configuration, while the cavity is compressed, the light-transmitting resin material is filled and solidified. Thus, by the flow of the light-transmitting resin material by compression, the light-transmitting resin material reliably reaches up to the deepest parts of the fine irregularities, which are provided in the lower mold. Thus, the fine irregularities formed in the resin panel can be produced at accurate dimensions minutely.

As one aspect, a step of setting a decorative sheet for decorating a front surface of the resin panel in the insert molding mold is preferably further provided.

According to this configuration, simultaneously with performing two-color molding on the resin panel including the first molded portion and the second molded portion, the decorative layer can be formed on the front surface of the resin panel, thereby providing good production efficiency.

Note that, as one aspect, the first molded portion used in the lamination step may be integrated with a decorative sheet for decorating a front surface of the resin panel in advance.

As one aspect, when the first molded portion is used in the low-pressure molding step, the first molded portion is preferably integrated with a decorative sheet for decorating a front surface of the resin panel in advance.

According to this configuration, since the first molded portion is integrated with the decorative sheet in advance, when a defect occurs in, for example, alignment of the display portion of the first molded portion with the decorative sheet, the defect can be removed before the integration of the second molded portion with the light source mounting substrate, and thus a yield as the illumination display panel is high.

DESCRIPTION OF EMBODIMENTS

First Embodiment

1. Structure of Illumination Display Panel

Figure 1:
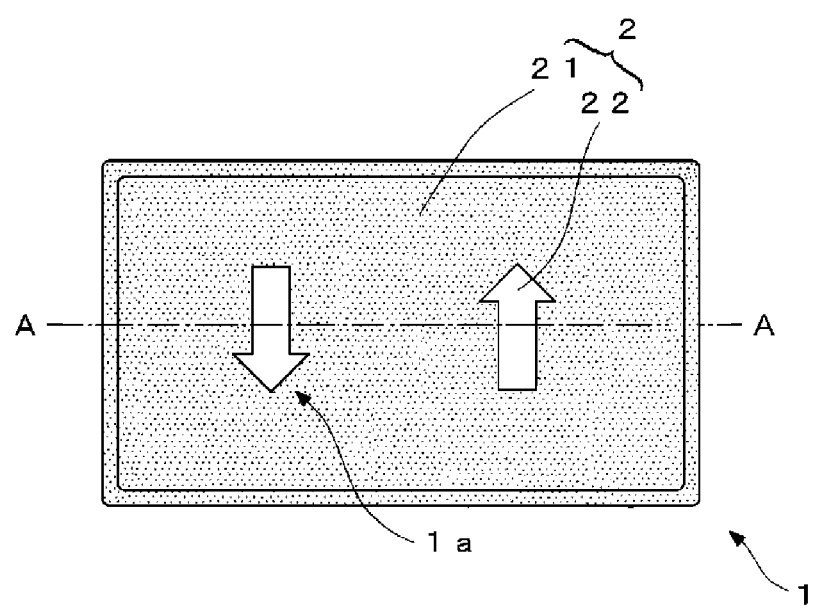
FIG. 1 is a plan view illustrating an example of an illumination display panel according to a first embodiment.
Figure 2:
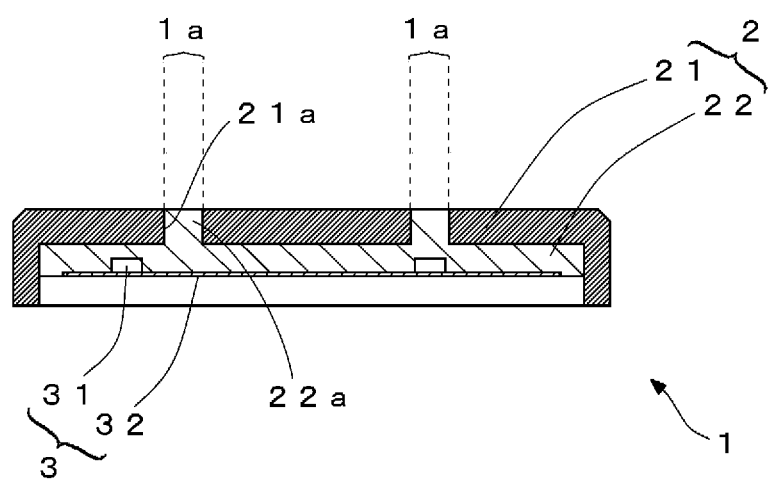
FIG. 2 is a cross-sectional view illustrating a cross-section taken along the line A-A of the illumination display panel in FIG. 1.

An illumination display panel 1 according to the first embodiment of this disclosure will be described below with reference to the drawings. FIG. 1 is a plan view illustrating an example of the illumination display panel according to the present invention. FIG. 2 is a cross-sectional view illustrating a cross-section taken along the line A-A of the illumination display panel in FIG. 1.

The illumination display panel 1 includes display portions 1a on which, for example, characters, logos, and images can be displayed in illumination, constitutes a portion of a housing, and includes a resin panel 2 and a light source mounting substrate 3. The resin panel 2 has a thin box shape having a rising portion around a rectangular planar portion.

The resin panel 2 includes a first molded portion 21 and a second molded portion 22. The first molded portion 21 is present at a portion excluding the display portions 1a. The second molded portion 22 is disposed on the back surface side of the first molded portion 21 and has protrusions 22a fitted with the first molded portion 21 at portions where the first molded portion 21 is absent.

As illustrated in FIG. 1 and FIG. 2, in the present embodiment, portions without the first molded portion 21 are through-holes, and the protrusions 22a of the second molded portion 22 are fitted with inner wall surfaces 21a of the through holes. Note that the front surfaces of the protrusions 22a of the second molded portion 22 are smooth surfaces, and the front surfaces of the protrusions 22a of the second molded portion 22 and the first molded portion 21 are flush.

Further, the second molded portion 22 is made of a light-transmitting resin, and the first molded portion 21 is made of an opaque resin. Here, the wording "light-transmitting resin" refers to a concept that includes a transparent resin and a translucent resin. The wording "opaque resin" refers to a concept that includes both a resin that is opaque due to inherently having a color and a resin that is opaque due to being colored with a pigment or the like. Further, the wording "opaque resin" refers to a concept that includes a resin having lower transmittance of light irradiated from light sources 31 than transmittance of light of the light-transmitting resin, and also a resin that does not have a function of completely blocking light. The second molded portion 22 and the first molded portion 21 have, in addition to functions of forming the shape as the housing of the resin panel 2, functions related to the light irradiated from the light sources 31.

The second molded portion 22 is disposed such that the light irradiated from the light sources 31 can pass through the second molded portion 22 and be guided to the display portion 1a in the resin panel 2. Note that the light sources 31 need not to be disposed directly below the display portions 1a, and can also be disposed on the back surface of the first molded portion 21 like the light source 31 on the left side among the two light sources 31 illustrated in FIG. 2. In this case, the light irradiated from the light source 31 is guided to immediately below the display portion 1a while repeating the total reflection in a light guide path portion in contact with the back surface of the first molded portion 21 of the second molded portion 22, and thus the light source 31 is not visible from the outside through the display portion 1a.

In the second molded portion 22, a thickness of the light guide path portion, which is covered with the first molded portion 21 and guides light to the display portion 1a, is preferably from 0.2 mm to 5.0 mm. With the thickness of the light guide path portion being 5.0 mm or less, the illumination display panel 1 can be made thinner by the thin wall thickness of the light guide path portion. However, unless the thickness of the light guide path portion is 0.2 mm or more, the light guiding function is significantly reduced. More preferably, the thickness of the light guide path portion is from 0.2 mm to 1.0 mm.

On the other hand, the first molded portion 21 is disposed so as to suppress unnecessary exit light to form a specific display pattern with the light from the light source 31. To this end, the opaque resin forming the first molded portion 21 preferably has light-shielding properties. For example, the opaque resin is colored black. However, when, for example, light is to be leaked at a lower luminous intensity than that of the second molded portion 22 in order to enhance a decorative effect, the first molded portion 21 does not completely perform light-shielding, but may be partially colored so as to be translucent. In other words, the first molded portion 21 only needs to have a lower transmittance of light than that of the second molded portion 22. In the example illustrated in FIG. 1, the two arrow symbols glowing on a dark background are arranged and displayed.

Note that, since the first molded portion 21 constitutes a part of the resin panel 2 as a molded article made of resin, peeling due to, for example, over time or wear does not occur as in a film and a printed thin film.

In the light source mounting substrate 3, the light sources 31 are mounted on a film substrate 32. A resin constituting the film substrate 32 is, for example, a polyethylene terephthalate (PET) resin, a cycloolefin polymer (COP) resin, a polycarbonate (PC) resin, and a polyimide (PI) resin.

Note that a wiring line (not illustrated) connected to the light source 31 is formed on the surface on which the light source 31 is mounted of the film substrate 32. Furthermore, a drive circuit as an integrated circuit for driving the light source 31 may be mounted on the film substrate 32.

Furthermore, as the light source 31, an Organic Light-Emitting Diode (OLED) can be used, in addition to an LED. To use the OLED in printing method, the "mounting" also includes direct formation of respective printing layers on the film substrate 32 in this specification.

As illustrated in FIG. 2, the light sources 31 of the light source mounting substrate 3 are sealed by the second molded portion 22. Thus, the light irradiated from the light sources 31 passes through the second molded portion 22 without passing through an air layer, passes through the display portions 1*a*, and is emitted upward of the resin panel 2.

As described later, after a measured light-transmitting resin material is injected into a cavity provided with a lower mold of a low-pressure molding mold, the light-transmitting resin material is filled and solidified at a low pressure while the cavity is compressed, thus molding the second molded portion 22. In other words, a low-pressure molding method is used. This is because, with the generally known injection molding method, when the light source mounting substrate 3 is set in an injection molding mold, damage or movement of the light sources 31 possibly occurs due to a resin pressure at high pressure.

In the present embodiment, a compression molding method is used as the low-pressure molding method. The compression molding is a molding method in which a molding material made of an uncured thermosetting resin is injected into a recessed portion (a cavity) of a heated mold, and then mold clamping is performed, and the molding material is filled and solidified (cured) at a low pressure while compression is performed.

Therefore, in the case of use of the compression molding method, the light-transmitting resin constituting the second molded portion 22 is, for example, a thermosetting resin, such as a silicone resin, a polyurethane resin, and an epoxy resin, or a combination thereof.

On the other hand, as described later, the first molded portion 21 is molded by the injection molding method generally known. Therefore, the resin constituting the first molded portion 21 is, for example, a thermoplastic resin, such as a polycarbonate (PC) resin, an ABS resin, and a polymethyl methacrylate (PMMA) resin, or a combination thereof.

2. Manufacturing Method of Illumination Display Panel (Manufacturing Process 1)

Hereinafter, the manufacturing method of the illumination display panel 1 according to the first embodiment will be described with reference to FIG. 3 to FIG. 8.

Figure 3:
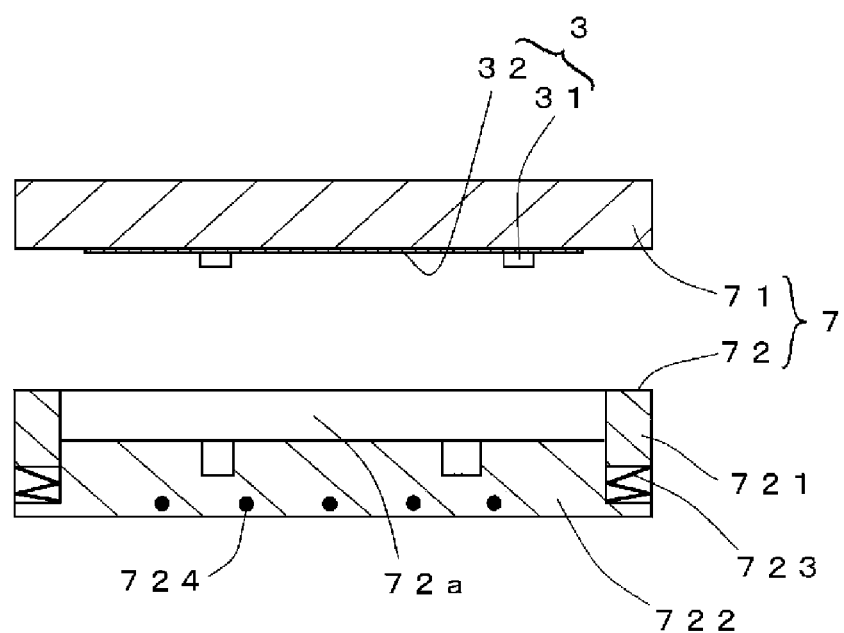
FIG. 3 is a cross-sectional view illustrating an example of a manufacturing step of the illumination display panel according to the first embodiment.

FIG. 3 illustrates an upper mold 71 and a lower mold 72 of a compression molding mold 7 before being clamped. First, the light source mounting substrate 3 is set to the upper mold 71 of the compression molding mold 7 with the mounted surface of the light sources 31 facing downward (see FIG. 3).

The light source mounting substrate 3 is suctioned by air using, for example, a suction hole and adsorbed to the upper mold 71.

Figure 4:
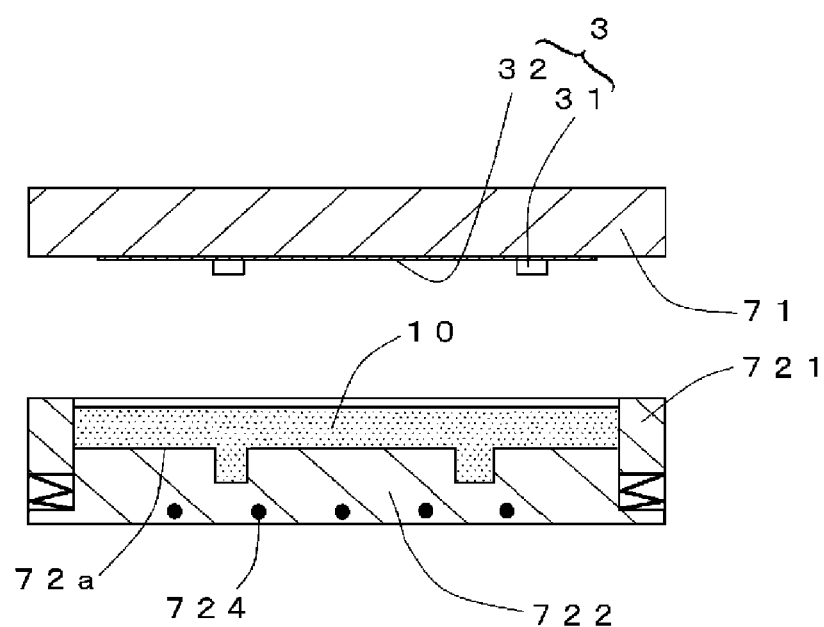
FIG. 4 is a cross-sectional view illustrating an example of a manufacturing step of the illumination display panel according to the first embodiment.

Next, a measured uncured thermosetting resin is injected into a cavity 72*a* provided with the lower mold 72 of the compression molding mold 7 as a light-transmitting resin material 10 (see FIG. 4).

FIG. 4 illustrates the lower mold 72 constituted of a cavity block 722 forming the bottom surface of the cavity 72*a* and a frame block 721 forming a side surface of the cavity 72*a*.

A spring 723 is provided on a lower portion of the frame block 721. Before the upper mold 71 and the lower mold 72 are clamped, the frame block 721 is at a raised position by the spring 723. Therefore, even when the light-transmitting resin material 10 is injected into the lower mold 72, the light-transmitting resin material 10 does not overflow out of the mold from the cavity 72*a*.

Figure 5:
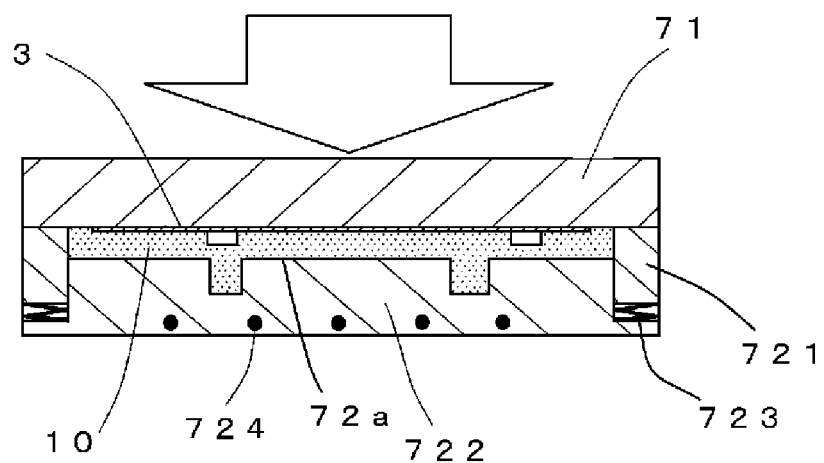
FIG. 5 is a cross-sectional view illustrating an example of a manufacturing step of the illumination display panel according to the first embodiment.

Note that, in the compression molding method illustrated in FIG. 3 to FIG. 5, the cavity block 722 is fixed to move up and down the frame block 721. However, the frame block 721 may be fixed to move up and down the cavity block 722, or both of the frame block 721 and the cavity block 722 may move up and down at different elevating distances.

Also, heaters 724 are built into the cavity block 722 to heat the lower mold 72.

Next, the compression molding mold 7 is clamped to set the cavity 72*a* in the sealed state. Subsequently, after clamping the compression molding mold 7, while the cavity 72*a* is compressed with the upper mold 71, the light-transmitting resin material 10 is filled and solidified (cured) at low pressure (see FIG. 5).

That is, the frame block 721 of the lower mold 72 is pushed down by the peripheral area of the lower surface of the upper mold 71 to compress the cavity 72*a* of the lower mold 72 and the light-transmitting resin material 10 injected therein. Thus, the light sources 31 of the light source mounting substrate 3 set to the upper mold 71 are immersed in the uncured light-transmitting resin material 10.

In this state, the light-transmitting resin material 10 is cured in the cavity 72*a* of the lower mold 72 by heating, and the second molded portion 22 is molded.

Note that, in the compression molding method illustrated in FIG. 5, the case in which the upper mold 71 is lowered with respect to the lower mold 72 to compress the cavity 72*a* of the lower mold 72 and the light-transmitting resin material 10 injected therein has been described, but the lower mold 72 may be raised with respect to the upper mold 71.

Figure 6:
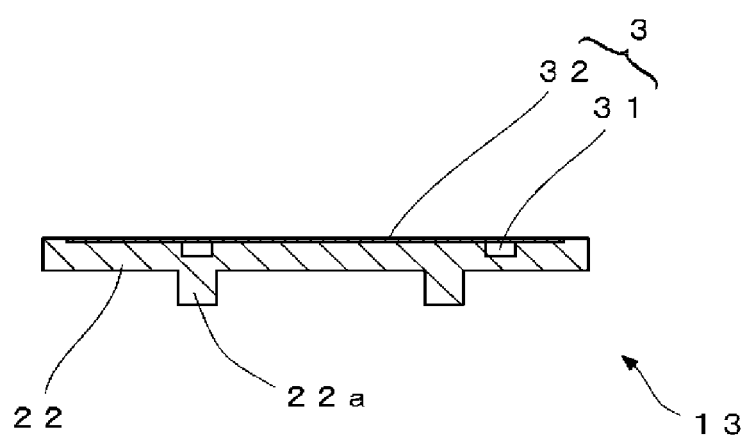
FIG. 6 is a cross-sectional view illustrating an example of a manufacturing step of the illumination display panel according to the first embodiment.

As illustrated in FIG. 6, the molded second molded portion 22 is integrated with the light source mounting substrate 3 so as to seal the light sources 31 by the second molded portion 22.

With the compression molding described above, when the second molded portion 22 is integrated with the light source mounting substrate 3 simultaneously with the molding of the second molded portion 22, the light-transmitting resin material 10 is filled with while the cavity 72*a* is compressed. Accordingly, even when the resin pressure inside the cavity 72*a* is not high, the light-transmitting resin material 10 can be sufficiently flowed, and the light-transmitting resin material 10 can reach up to the corners inside the cavity 72*a*. Thus, the light sources 31 can be sealed without damage or movement of the light sources 31 during molding of the second molded portion 22. In the example illustrated in FIG. 6, not only the light sources 31, but also the entire light source mounting substrate 3 excluding the back surface thereof is sealed with the light-transmitting resin material 10.

In addition, even when the second molded portion 22 has a thin wall, by the flow of the light-transmitting resin material 10 by compression, the light-transmitting resin material 10 can reach up to the corners inside the cavity 72*a*. This allows preventing a defect of having an incomplete filled portion in a portion of the second molded portion 22. In the second molded portion 22, this is particularly effective in the light guide path portion, which is located behind the first molded portion 21 and guides light to the display portion 1*a*, because the light guide path portion has an extremely thin wall.

To describe further, a degree of freedom of selection of the thicknesses of the light source 31 and other electronic components mounted on the light source mounting substrate 3 is high. In other words, selecting a thin electronic component that is less susceptible to the resin pressure during molding of the second molded portion 22 is unnecessary. Furthermore, to be less susceptible to the resin pressure during molding of the second molded portion 22, separately protecting and reinforcing (fixing) the electronic component by means, such as a potting, is unnecessary.

Figure 7:
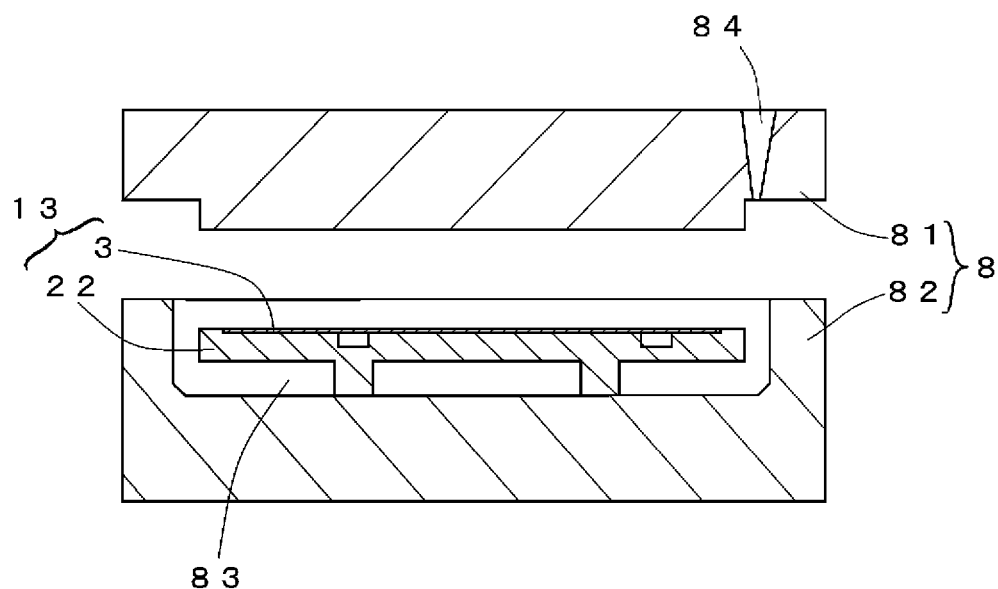
FIG. 7 is a cross-sectional view illustrating an example of a manufacturing step of the illumination display panel according to the first embodiment.

Next, an integrally molded product 13 of the light source mounting substrate 3 and the second molded portion 22 is set inside an insert molding mold 8 formed of a male mold 81 and a female mold 82 with the second molded portion 22 side facing a cavity 83 (see FIG. 7).

In the example of the insert molding mold 8 illustrated in FIG. 7, the male mold 81 and the female mold 82 are opened and closed up and down, and the integrally molded product 13 is housed in the female mold 82 located on the lower side. The integrally molded product 13 on the second molded portion 22 side is in contact with the female mold 82 at the front surfaces of the protrusions 22a. On the other hand, the whole integrally molded product 13 on the light source mounting substrate 3 side is in contact with the male mold 81 when the mold clamping is performed. In addition, in the present embodiment, an injection molding machine (not illustrated) is a vertical type and communicates with an injection port 84 in the male mold 81 illustrated in FIG. 7.

Figure 8:
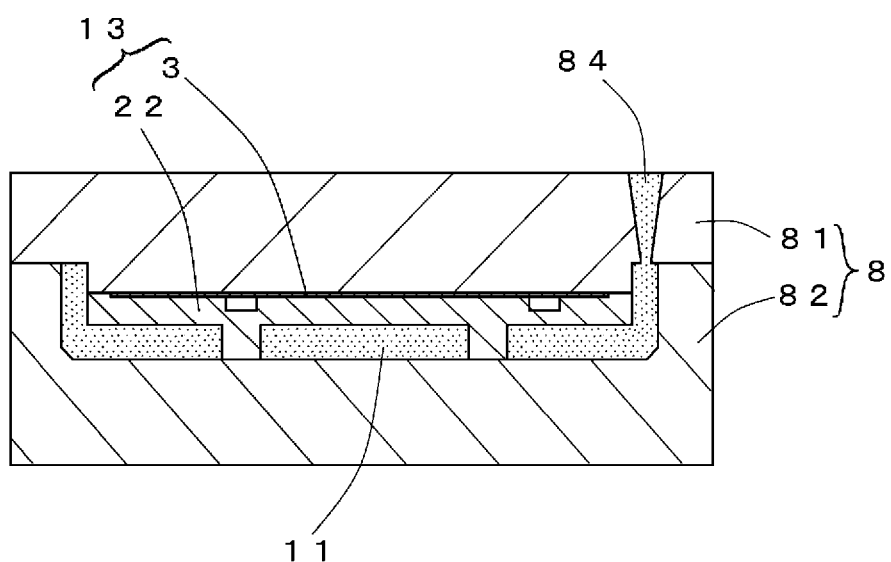
FIG. 8 is a cross-sectional view illustrating an example of a manufacturing step of the illumination display panel according to the first embodiment.

Finally, after the insert molding mold 8 is clamped, an opaque resin material 11 made of a thermoplastic resin in a molten state is injected from the injection port 84 into the cavity 83 of the insert molding mold 8 to fill the cavity 83 and is solidified (see FIG. 8). Thus, simultaneous with the molding of the first molded portion 21, the first molded portion 21 can be integrated with the integrally molded product 13 of the light source mounting substrate 3 and the second molded portion 22.

The illumination display panel removed from the inside of the insert molding mold 8 is as illustrated in FIG. 1 and FIG. 2.

3. Another Manufacturing Method of Illumination Display Panel (Manufacturing Process 2)

In the above-described manufacturing process 1, the case in which, after the second molded portion 22 is integrated with the light source mounting substrate 3, insert molding is further performed using the integrally molded product 13 of the light source mounting substrate 3 and the second molded portion 22 for integration with the first molded portion 21 has been described, but the manufacturing process is not limited to this manufacturing process with the illumination display panel 1 of the present embodiment.

Figure 9:
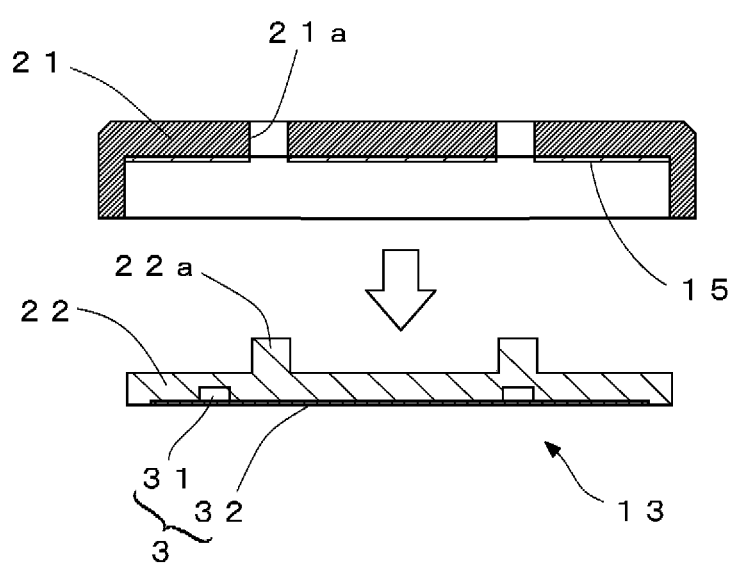
FIG. 9 is a cross-sectional view illustrating another example of a manufacturing step of the illumination display panel according to the first embodiment.

In other words, in the present manufacturing process 2 illustrated in FIG. 9, after the second molded portion 22 is integrated with the light source mounting substrate 3, the separately molded first molded portion 21 is laminated on the integrally molded product 13 of the light source mounting substrate 3 and the second molded portion 22.

The main point of the present manufacturing process 2 different from the manufacturing process 1 is only the laminating step, and therefore the descriptions of the other steps will be omitted.

Figure 10:
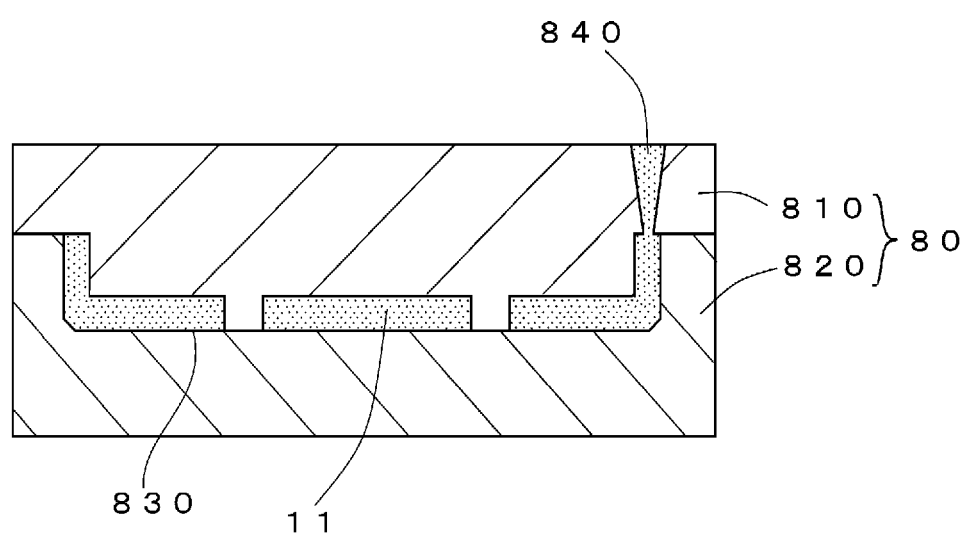
FIG. 10 is a cross-sectional view illustrating another example of a manufacturing step of the illumination display panel according to the first embodiment.

The separately molded first molded portion 21 used in the lamination in the present manufacturing process 2 is preferably molded by the generally known injection molding method. That is, as illustrated in FIG. 10, the opaque resin material 11 made of the thermoplastic resin in the molten state is injected from an injection port 840 into a cavity 830 of an injection molding mold 80 formed of a male mold 810 and a female mold 820 to fill the cavity 830 and is solidified.

The opaque resin material 11 used is the same as that used during the insert molding in the manufacturing process 1.

Returning to FIG. 9, the separately molded first molded portion 21 is laminated on the integrally molded product 13 of the light source mounting substrate 3 and the second molded portion 22 by pasting using an adhesive 15.

As the adhesive 15, in addition to an Optical Clear Adhesive (OCA: optical adhesive sheet), the known adhesive for lamination can be used.

Note that in the example illustrated in FIG. 9, the adhesive 15 is provided on the first molded portion 21 side, but the adhesive 15 may be provided on the first molded portion 21 side of the integrally molded product 13 for pasting.

4. Another Manufacturing Method of Illumination Display Panel (Manufacturing Process 3)

In the manufacturing process 1 and the manufacturing process 2, the case in which, after the second molded portion 22 is integrated with the light source mounting substrate 3, the integrally molded product 13 of the light source mounting substrate 3 and the second molded portion 22 is further integrated with the first molded portion 21 has been described, but the illumination display panel 1 of the present embodiment is not limited to the manufacturing process 1 and the manufacturing process 2.

Figure 11:
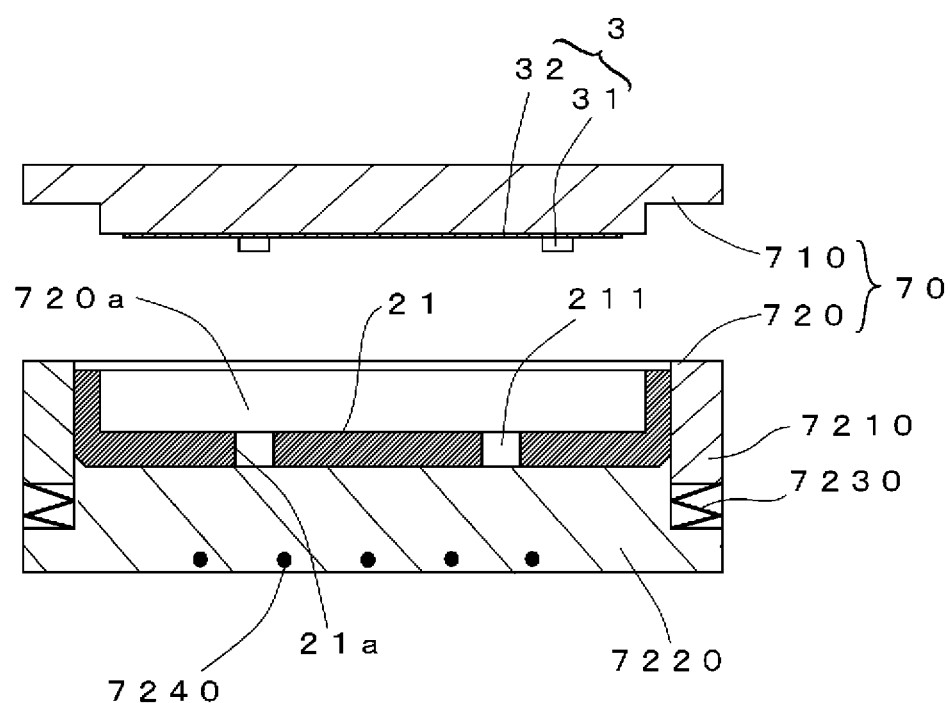
FIG. 11 is a cross-sectional view illustrating another example of a manufacturing step of the illumination display panel according to the first embodiment.
Figure 12:
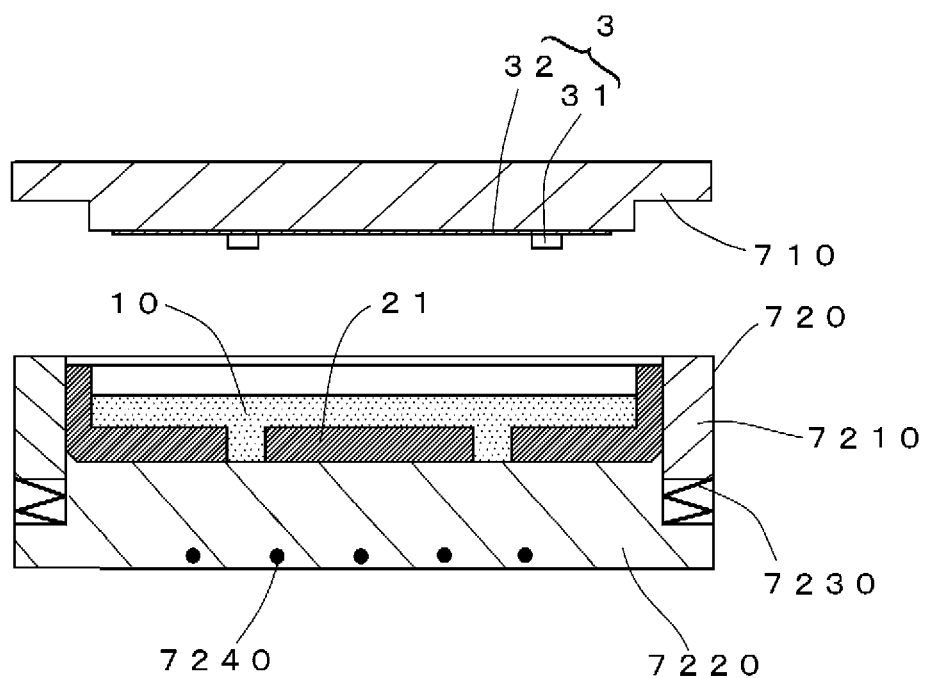
FIG. 12 is a cross-sectional view illustrating another example of a manufacturing step of the illumination display panel according to the first embodiment.
Figure 13:
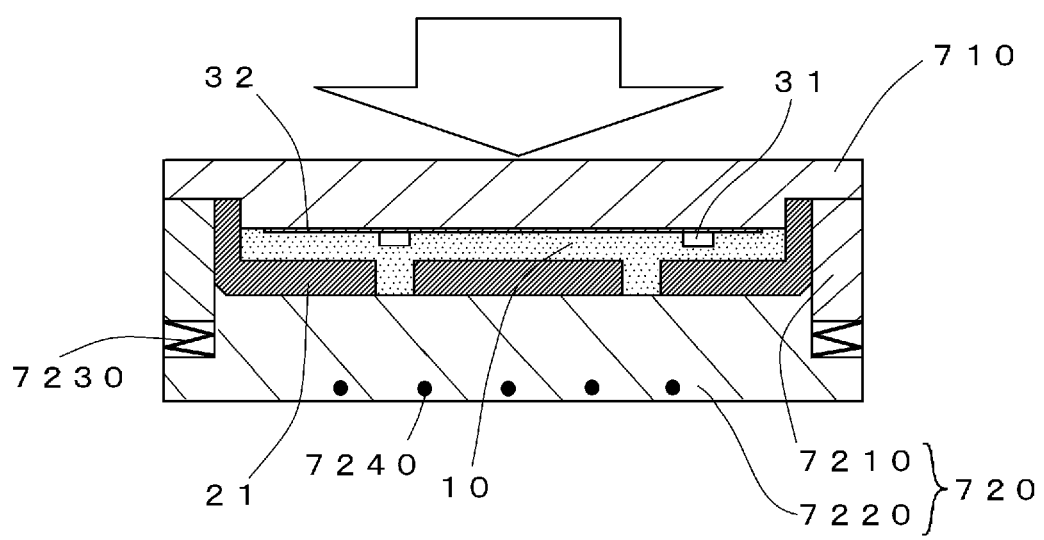
FIG. 13 is a cross-sectional view illustrating another example of a manufacturing step of the illumination display panel according to the first embodiment.

In other words, in the present manufacturing process 3 illustrated in FIG. 11 to FIG. 13, in compression molding, the second molded portion 22 is simultaneously integrated with the light source mounting substrate 3 and the separately molded first molded portion 21.

First, before injecting the light-transmitting resin material 10, the separately molded first molded portion 21 is set in a cavity 720a provided with a lower mold 720 of a compression molding mold 70 (see FIG. 11).

The separately molded first molded portion 21 used in the present manufacturing process 3 can be molded with the material and the molding method (see FIG. 10) similar to those of the first molded portion 21 in the manufacturing process 2.

Note that the first molded portion 21 made of the thermoplastic resin is configured not to melt to the extent that the shape of the first molded portion 21 can no longer be completely maintained during molding of the second molded portion 22. Therefore, the resin constituting the first molded portion 21 used in the present manufacturing process 3 preferably has a softening temperature equal to or higher than a heating temperature during molding of the second molded portion 22.

FIG. 11 illustrates the lower mold 720 constituted of a cavity block 7220 forming the bottom surface of the cavity 720a and a frame block 7210 forming a side surface of the cavity 720a.

A spring 7230 is provided on a lower portion of the frame block 7210. Before clamping an upper mold 710 and the lower mold 720, the frame block 7210 is at a raised position by the spring 7230. Therefore, even when the light-transmitting resin material 10 is injected into the lower mold 720, the light-transmitting resin material 10 does not overflow out of a cavity 720a.

Note that, as illustrated in FIG. 11, unlike the compression molding molds 7 of the manufacturing process 1 and the manufacturing process 2, in the lower mold 720 of the compression molding mold 70 of the present manufacturing process 3, the cavity block 7220 forming the bottom surface of the cavity 720a does not have recessed portions corresponding to the protrusions 22a of the second molded portion 22. Through-holes 211 in the first molded portion 21 correspond to the recessed portions.

Also, heaters 7240 are built into the cavity block 7220 similarly to the manufacturing process 1 and the manufacturing process 2 to heat the lower mold 720.

Next, similarly to the manufacturing process 1 and the manufacturing process 2, a measured uncured thermosetting resin is injected into the cavity 720a in which the first molded portion 21 is set of the lower mold 720 as the light-transmitting resin material 10 (see FIG. 12).

Next, the compression molding mold 70 is clamped to set the cavity 720a in the sealed state. Subsequently, after clamping the compression molding mold 70, while the cavity 720a is compressed with the upper mold 710, the light-transmitting resin material 10 is filled and solidified (cured) at low pressure (see FIG. 13).

That is, the frame block 7210 of the lower mold 720 is pushed down by the peripheral area of the lower surface of the upper mold 710 to compress the cavity 72a of the lower mold 720 and the light-transmitting resin material 10 injected therein. Thus, the light sources 31 of the light source mounting substrate 3 set to the upper mold 710 are immersed in the uncured light-transmitting resin material 10.

In this state, the light-transmitting resin material 10 is cured in the cavity 720a of the lower mold 720 by heating, and the second molded portion 22 is molded.

Note that even when the first molded portion 21 set in the cavity 720a of the lower mold 720 has an undercut portion (not illustrated) between the first molded portion 21 and the lower mold 720 in the inner wall surface 21a of the through-hole 211, the light-transmitting resin material 10 reaches up to the undercut portion by the flow of the light-transmitting resin material 10 by compression.

The second molded portion 22 molded in this manner is integrated with the light source mounting substrate 3 and the first molded portion 21 so as to seal the light sources 31 with the second molded portion 22 (see FIG. 2).

Second Embodiment

1. Structure of Illumination Display Panel 100

In the first embodiment, the case in which the front surface of the resin panel 2 is exposed has been described, but the illumination display panel of the present invention is not limited thereto.

Figure 14:
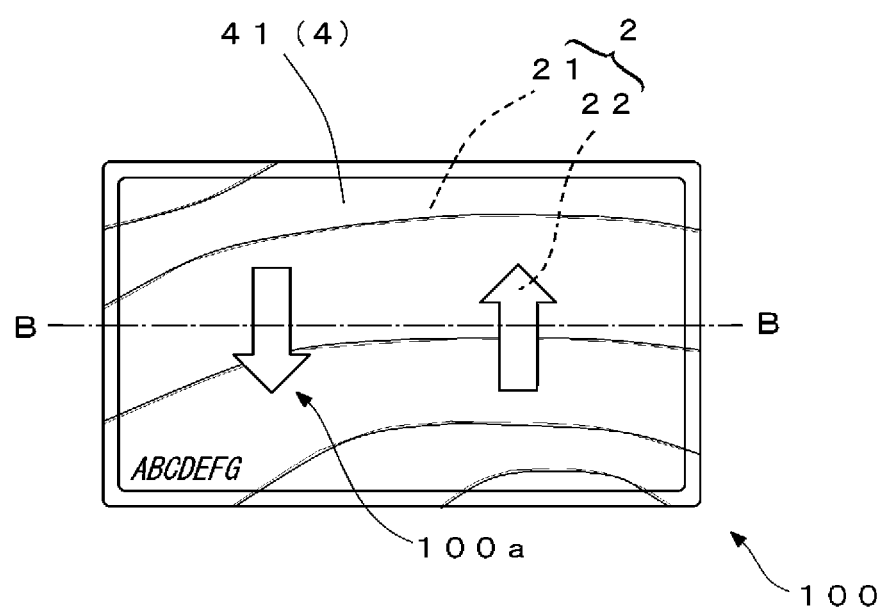
FIG. 14 is a plan view illustrating an example of an illumination display panel according to a second embodiment.
Figure 15:
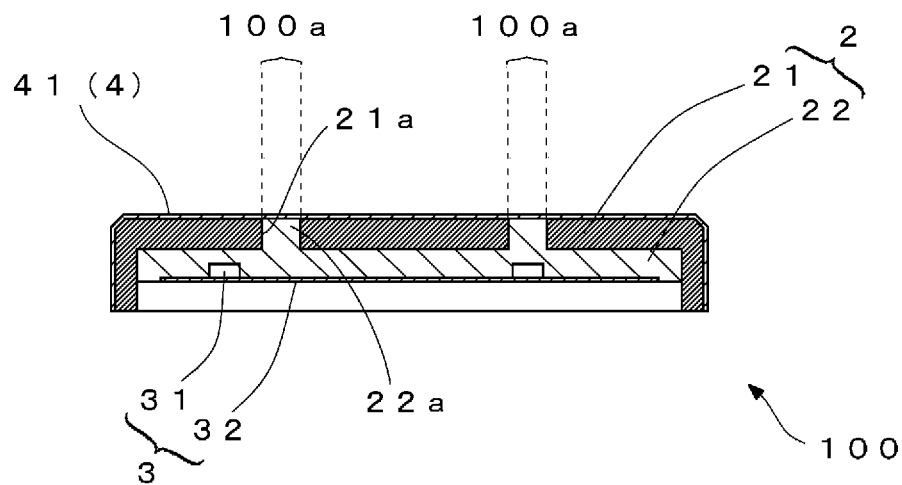
FIG. 15 is a cross-sectional view illustrating a cross-section taken along the line B-B of the illumination display panel in FIG. 14.

For example, FIG. 14 is a plan view illustrating an example of an illumination display panel according to a second embodiment. FIG. 15 is a cross-sectional view illustrating a cross-section taken along the line B-B of the illumination display panel in FIG. 14.

An illumination display panel 100 according to the second embodiment is different from the first embodiment in that the illumination display panel 100 further includes a decorative layer 4 to decorate the front surface of the resin panel 2. In the illumination display panel 100 illustrated in FIG. 14 and FIG. 15, the decorative layer 4 covers the entire front surface of the resin panel 2 and adds decorative properties other than the display in illumination. In the example of the illumination display panel 100 illustrated in FIG. 14, a woodgrain pattern is formed in a portion other than display portions 100a, and a logo "ABCDEFG" is further provided on the illumination display panel 100.

The decorative layer 4 is, for example, a decorative sheet 41.

The decorative sheet 41 includes a base film and a graphic layer. A transparent resin is used for the base film. The base film may be made of, for example, a resin film made of a polyester resin, a polyethylene terephthalate (PET) resin, an acrylic resin, a polycarbonate resin, a polybutylene terephthalate (PBT) resin, a triacetyl cellulose resin, a styrene resin, or an ABS resin, a multilayer film made of an acrylic resin and an ABS resin, or a multilayer film made of an acrylic resin and a polycarbonate resin. The thickness of the base film is preferably selected from a range, for example, from 30 μm to 500 μm.

The graphic layer is a layer used to express a design such as an illustration. The graphic layer is formed on the base film using, for example, gravure printing or screen printing. The materials forming the graphic layer may be, for example, an acrylic resin, a vinyl chloride vinyl acetate copolymer resin, a thermoplastic urethane resin or a polyester resin, and a pigment or dye that is added to the resin. The graphic layer may also have a metallic design formed using, for example, an insulated aluminum paste or mirror ink.

Even when a defect of printing or coating occurs in the decorative sheet 41 during the formation of the graphic layer to the base film, it is only necessary to dispose of the defective portion of the decorative sheet 41. Therefore, the yield is high compared with a case of directly printing and coating the integrally molded product of the resin panel 2 and the light source mounting substrate 3 after molding.

A hardcoat layer for improving surface strength and imparting scratch resistance may be formed on the decorative sheet 41. Additionally, an adhesive layer may be formed on the decorative sheet 41 to improve adhesiveness between the decorative sheet 41 and the resin panel 2.

The graphic layer is transparent at the display portions 100a on the decorative sheet 41. Therefore, in the display portions 100a on the decorative sheet 41, the light irradiated from the light sources 31 is emitted to the outside after passing through the base film and the graphic layer.

As described above, the illumination display panel 100 of the present second embodiment includes the decorative layer 4. Thus, a degree of freedom of design is higher than decoration with a monochromatic opaque color exhibited by the first molded portion 21, and therefore a complex shape, multi-colors, and a variety of patterns can be treated.

2. Manufacturing Method of Illumination Display Panel 100 (Manufacturing Process 4)

Hereinafter, the manufacturing method of the illumination display panel 100 according to the second embodiment will be described with reference to FIG. 16 to FIG. 18.

The manufacturing method of the illumination display panel 100 according to the second embodiment differs from the manufacturing method of the illumination display panel 1 according to the first embodiment only in the coating step of the decorative sheet 41 in the case of the present manufacturing process 4, the decorative sheet 41 is coated in the insert molding step in the manufacturing process 1 of the first embodiment.

Figure 16:
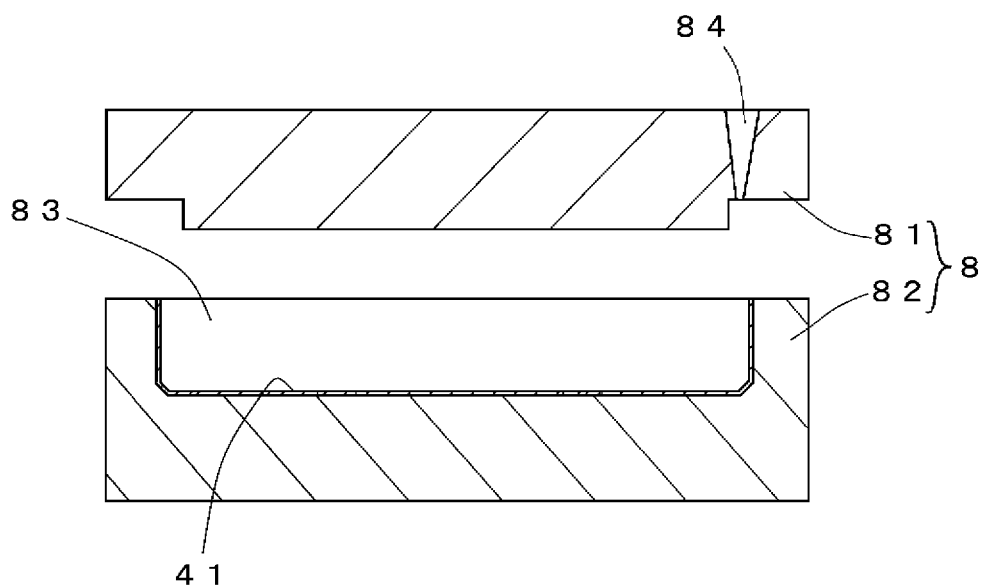
FIG. 16 is a cross-sectional view illustrating an example of a manufacturing step of an illumination display panel according to the second embodiment.

In other words, the decorative sheet 41 for decorating the front surface of the resin panel 2 is set inside the insert molding mold 8 formed of the male mold 81 and the female mold 82 with the graphic layer (not illustrated) side facing the cavity 83 (see FIG. 16).

The decorative sheet 41 is suctioned by air using, for example, a suction hole and adsorbed to the inner surface of the female mold 82. Note that in the example illustrated in FIG. 16, the decorative sheet 41 is pre-formed so as to run along the inner surface of the cavity 83 of the female mold 82.

Figure 17:
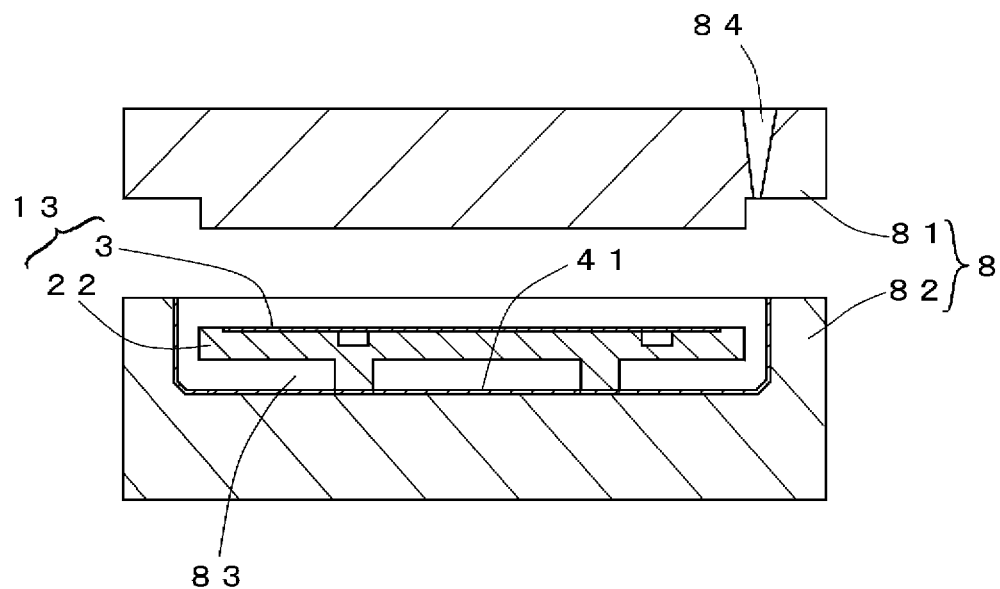
FIG. 17 is a cross-sectional view illustrating an example of a manufacturing step of the illumination display panel according to the second embodiment.

Next, the integrally molded product 13 of the light source mounting substrate 3 and the second molded portion 22, which has been molded similarly to the compression molding of the manufacturing process 1 (see FIG. 3 to FIG. 6), is set inside the insert molding mold 8 formed of the male mold 81 and the female mold 82 with the second molded portion 22 side facing the cavity 83 (see FIG. 17).

In the example of the insert molding mold 8 illustrated in FIG. 17, the integrally molded product 13 on the second molded portion 22 side is in contact with the decorative sheet 41, which is disposed along the inner surface of the cavity 83 of the female mold 82, with the front surfaces of the protrusions 22a.

Figure 18:
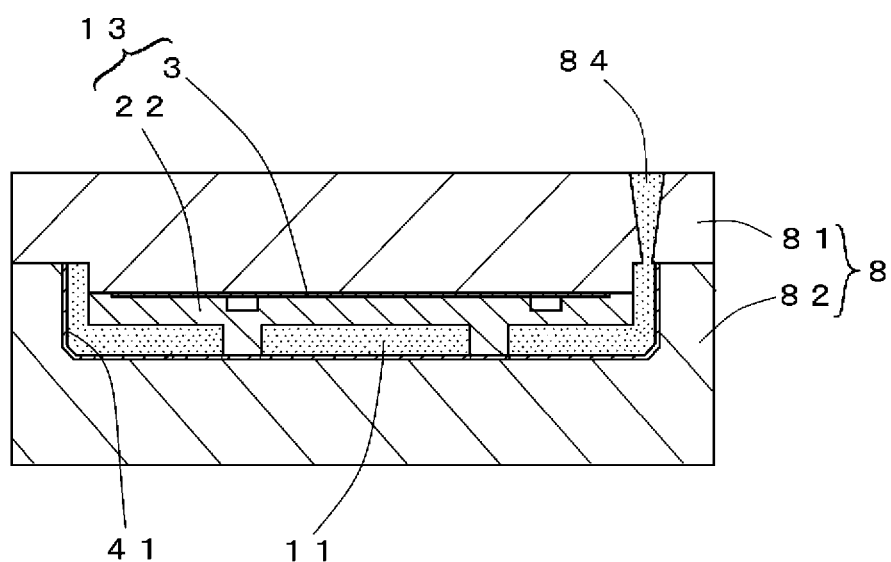
FIG. 18 is a cross-sectional view illustrating an example of a manufacturing step of the illumination display panel according to the second embodiment.

Next, after clamping the insert molding mold 8, the opaque resin material 11 made of the thermoplastic resin in the molten state is injected from the injection port 84 into the cavity 83 of the insert molding mold 8 to fill the cavity 83 and is solidified (see FIG. 18). Thus, simultaneously with the molding of the first molded portion 21, the first molded portion 21 can be integrated with the integrally molded product 13 of the light source mounting substrate 3 and the second molded portion 22 and the decorative sheet 41.

Since the others are similar to the insert molding step in the manufacturing process 1, the descriptions thereof will be omitted.

3. Manufacturing Method of Illumination Display Panel 100 (Manufacturing Process 5)

In the manufacturing process 4, the case in which the decorative sheet 41 is coated in the insert molding step has been described, but the manufacturing process is not limited to this manufacturing process with the illumination display panel 100 of the present second embodiment.

Figure 19:
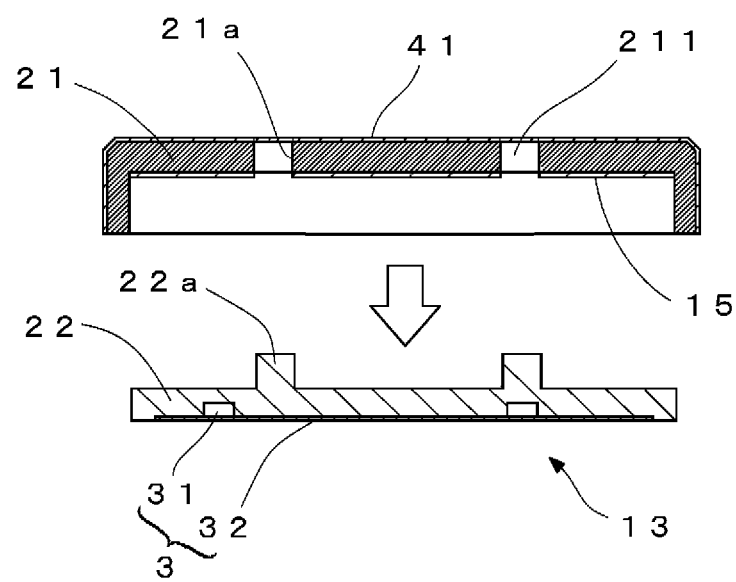
FIG. 19 is a cross-sectional view illustrating another example of a manufacturing step of the illumination display panel according to the second embodiment.

In other words, in the present manufacturing process 5 illustrated in FIG. 19, after the second molded portion 22 is integrated with the light source mounting substrate 3, the separately molded first molded portion 21 that is preliminarily integrated with the decorative sheet 41 for decorating the front surface of the resin panel 2 is laminated on the integrally molded product 13 of the light source mounting substrate 3 and the second molded portion 22.

The main point of the present manufacturing process 5 different from the manufacturing process 4 is only the laminating step, and therefore the descriptions of the other steps will be omitted.

The first molded portion 21 with the decorative sheet 41 to be laminated is preferably molded by insert molding method.

Figure 20:
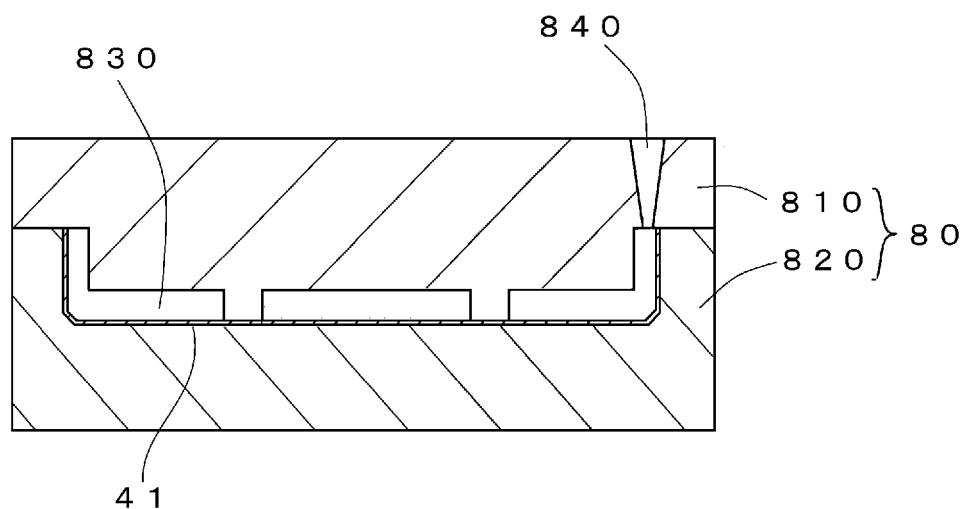
FIG. 20 is a cross-sectional view illustrating another example of a manufacturing step of the illumination display panel according to the second embodiment.

In other words, first, the decorative sheet 41 for decorating the front surface of the resin panel 2 is set in the cavity 830 of the injection molding mold 80 formed of the male mold 810 and the female mold 820 with the graphic layer side facing the cavity 830 (see FIG. 20).

The decorative sheet 41 is suctioned by air using, for example, a suction hole and adsorbed to the inner surface of the female mold 820. Note that in the example illustrated in FIG. 20, the decorative sheet 41 is pre-formed so as to run along the inner surface of the cavity 830 of the female mold 820.

Figure 21:
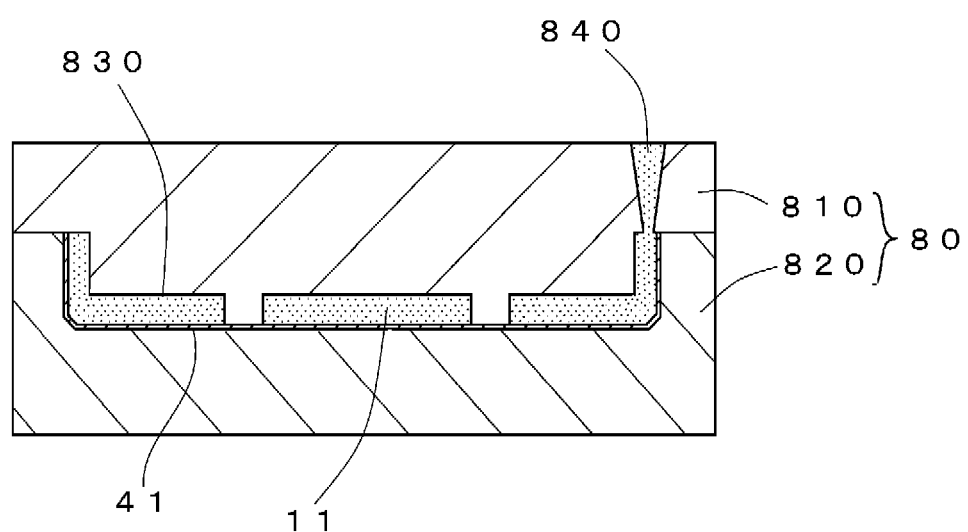
FIG. 21 is a cross-sectional view illustrating another example of a manufacturing step of the illumination display panel according to the second embodiment.

Next, as illustrated in FIG. 21, the opaque resin material 11 made of the thermoplastic resin in the molten state is injected from the injection port 840 into the cavity 830 of the injection molding mold 80 formed of the male mold 810 and the female mold 820 to fill the cavity 830 and is solidified.

The opaque resin material 11 used is the same as that used during the insert molding in the manufacturing process 1.

Returning to FIG. 19, similarly to the manufacturing process 2 of the first embodiment, the first molded portion 21 with the decorative sheet 41 is laminated on the integrally molded product 13 of the light source mounting substrate 3 and the second molded portion 22 by pasting using the adhesive 15.

Note that in the example illustrated in FIG. 19, the adhesive 15 is provided on the first molded portion 21 side, but the adhesive 15 may be provided on the first molded portion 21 side of the integrally molded product 13 for pasting.

4. Manufacturing Method of Illumination Display Panel 100 (Manufacturing Process 6)

In the manufacturing process 4 and the manufacturing process 5, the case in which, after the second molded portion 22 is integrated with the light source mounting substrate 3, the integrally molded product 13 of the light source mounting substrate 3 and the second molded portion 22 is further integrated with the first molded portion 21 with the decorative sheet 41 has been described, but the manufacturing process of the illumination display panel 100 of the present embodiment is not limited to the manufacturing process 4 or the manufacturing process 5.

Figure 22:
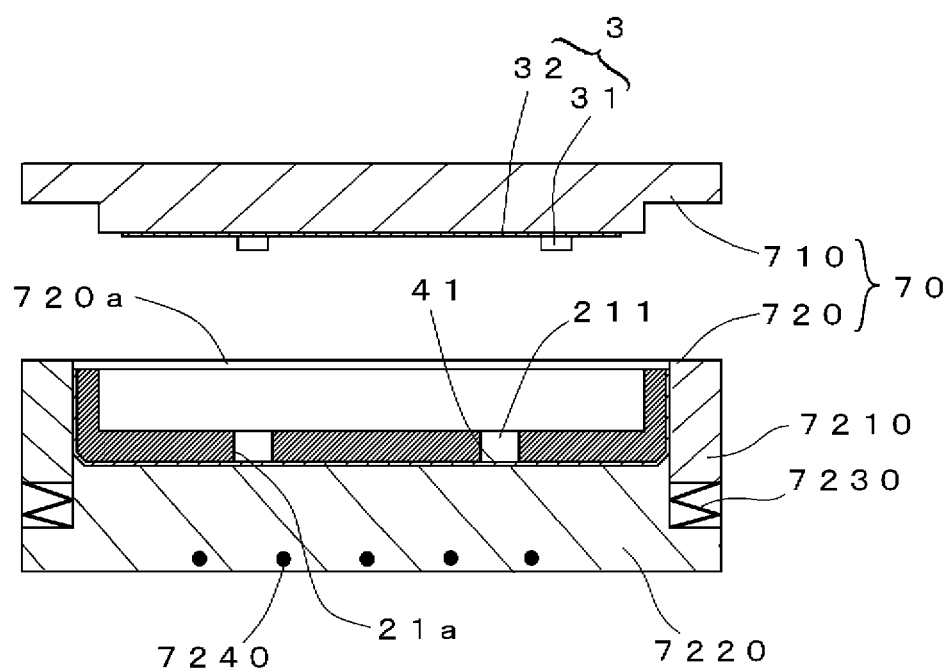
FIG. 22 is a cross-sectional view illustrating another example of a manufacturing step of the illumination display panel according to the second embodiment.
Figure 23:
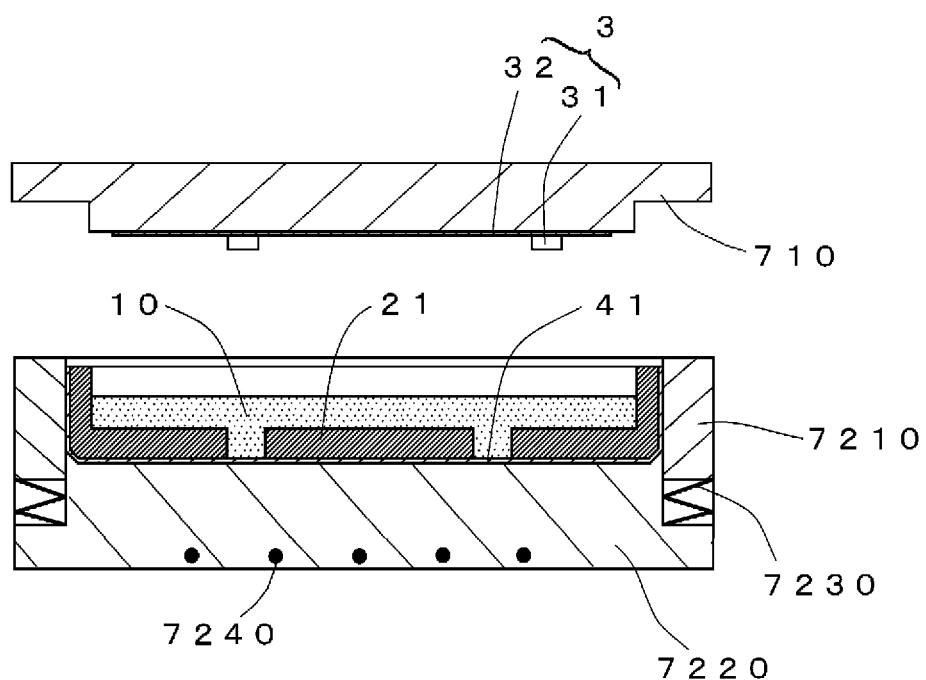
FIG. 23 is a cross-sectional view illustrating another example of a manufacturing step of the illumination display panel according to the second embodiment.
Figure 24:
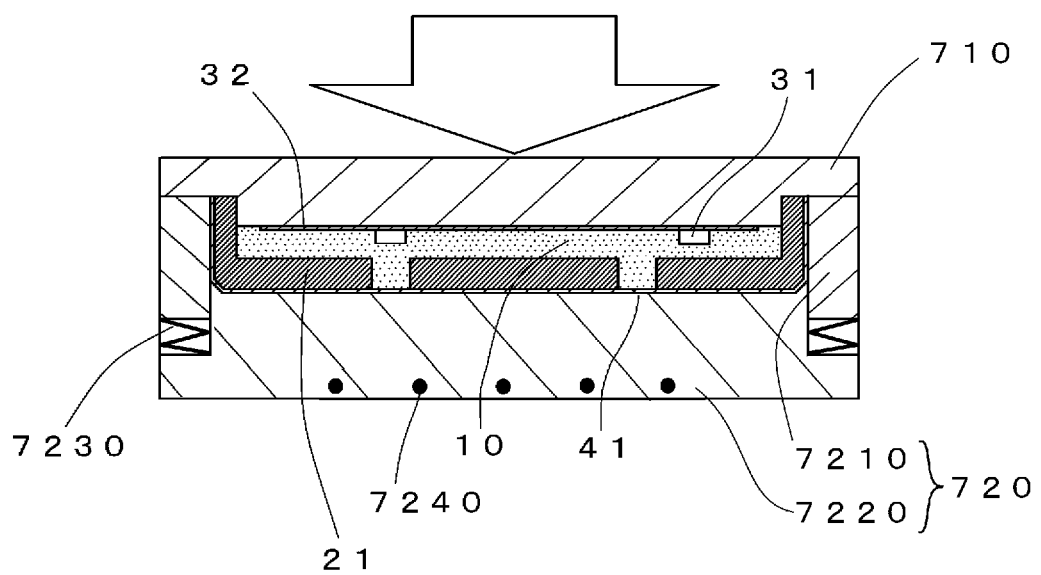
FIG. 24 is a cross-sectional view illustrating another example of a manufacturing step of the illumination display panel according to the second embodiment.

In other words, in the present manufacturing process 3 illustrated in FIG. 22 to FIG. 24, in compression molding, the second molded portion 22 is simultaneously integrated with the light source mounting substrate 3 and the separately molded first molded portion 21 with the decorative sheet 41.

First, before injecting the light-transmitting resin material 10, the separately insert molded first molded portion 21 with the decorative sheet 41 is set in the cavity 720a provided with the lower mold 720 of the compression molding mold 70 (see FIG. 22).

The separately insert molded first molded portion 21 with the decorative sheet 41 used in the present manufacturing process 6 can be molded with the material and the molding method (see FIG. 20 and FIG. 21) similar to those of the first molded portion 21 with the decorative sheet 41 in the manufacturing process 5.

Next, similarly to the compression molding of the manufacturing processes 1 to 5, the measured uncured thermosetting resin is injected into the cavity 720a in which the first molded portion 21 with the decorative sheet 41 is set of the lower mold 720 as the light-transmitting resin material 10 (see FIG. 23).

Next, the compression molding mold 70 is clamped to set the cavity 720a in the sealed state. Subsequently, after clamping the compression molding mold 70, while the cavity 720a is compressed, the light-transmitting resin material 10 is filled and solidified (cured) at low pressure (see FIG. 24).

The other points are similar to the compression molding of the manufacturing processes 1 to 5, and therefore the descriptions thereof will be omitted.

VARIOUS MODIFIED EXAMPLES

Modified Example 1

In the first embodiment and the second embodiment described above, the case in which the portions where the first molded portion 21 is absent are the through-holes and the protrusions 22a of the second molded portion 22 are fitted with the inner wall surfaces 21a of the through holes has been described, but the resin panel in the present invention is not limited thereto.

Figure 25:
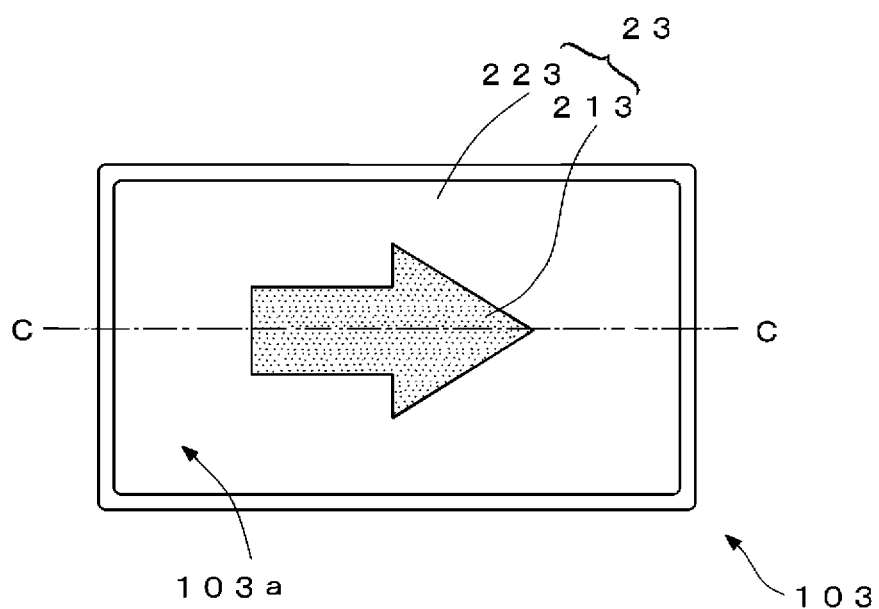
FIG. 25 is a plan view illustrating an example of an illumination display panel using a resin panel in another display pattern.
Figure 26:
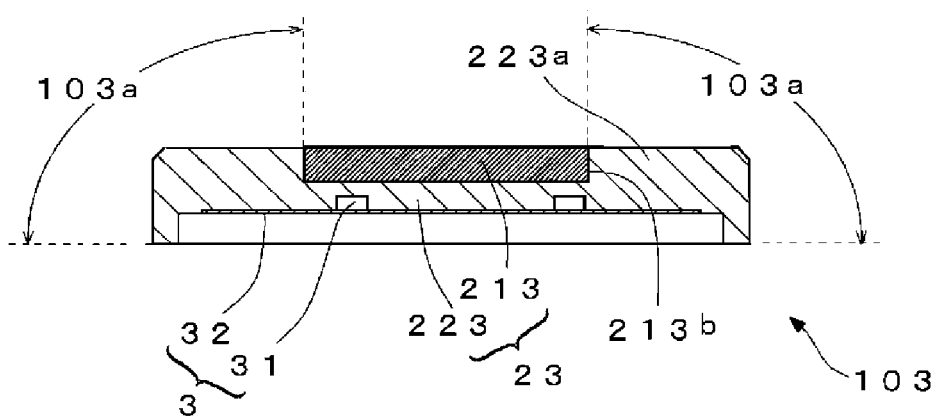
FIG. 26 is a cross-sectional view illustrating a cross-section taken along the line C-C of the illumination display panel in FIG. 25.

FIG. 25 is a plan view illustrating an example of an illumination display panel 103 with a display portion 103a using a resin panel in another display pattern. FIG. 26 is a cross-sectional view illustrating a cross-section taken along the line C-C of the illumination display panel in FIG. 25.

As illustrated in FIG. 25 and FIG. 26, in a resin panel 23 in the present modified example, a protrusion 223a of a second molded portion 223 is fitted with a side surface 213b of a first molded portion 213. More specifically, the second molded portion 223 coats the peripheral area and the back surface of the first molded portion 213 having an arrow shape in plan view. In other words, the peripheral area of the first molded portion 21 having the arrow shape in plan view is illuminated. That is, the arrow symbol is displayed in the bright background so as to be light-shielded.

Figure 27:
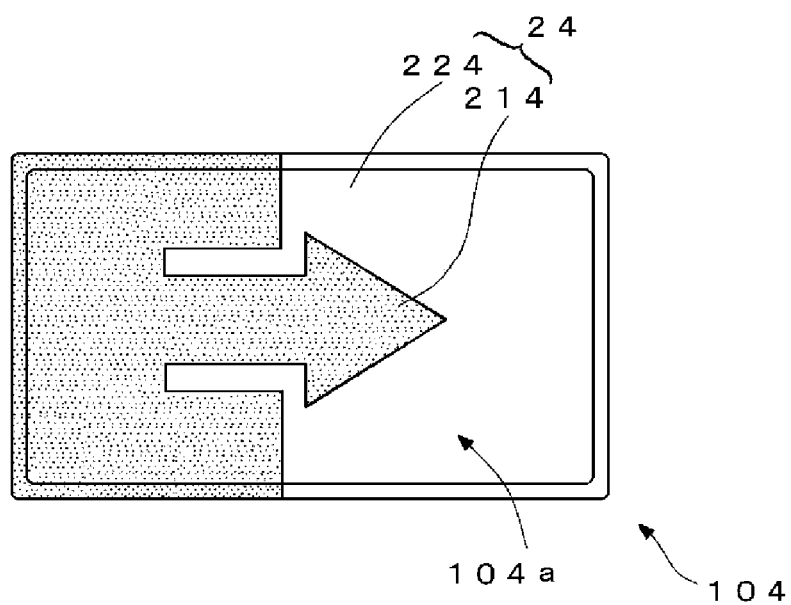
FIG. 27 is a plan view illustrating an example of an illumination display panel using a resin panel in another display pattern.

Note that, in the modified example 1 illustrated in FIG. 25 and FIG. 26, the second molded portion 223 of the resin panel 23 surrounds the peripheral area of the first molded portion 213 in plan view, but a second molded portion 224 of a resin panel 24 may only be adjacent to a first molded portion 214 in plan view of an illumination display panel 104 with a display portion 104a (see FIG. 27).

Modified Example 2

In the first embodiment and the second embodiment described above, the case in which the front surface of the protrusion 22a of the second molded portion 22 of the resin panel 2 has the smooth surface has been described, but the resin panel in the present invention is not limited thereto.

Figure 28:
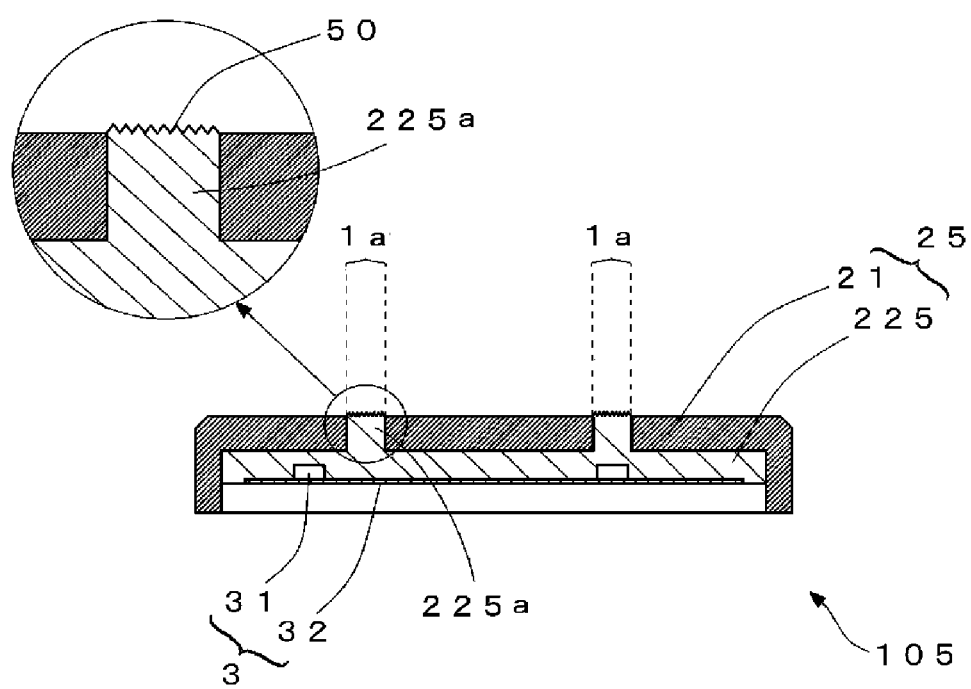
FIG. 28 is a plan view illustrating an example of an illumination display panel having fine irregularities in a display portion.

For example, in a second example of an illumination display panel 105, a resin panel 25 has fine irregularities 50 on front surfaces of protrusions 225a of a second molded portion 225 (see FIG. 28). These fine irregularities 50 serve as, for example, a decorative function, such as matte, and an optical function, such as diffusion effect or lens effect.

Figure 29:
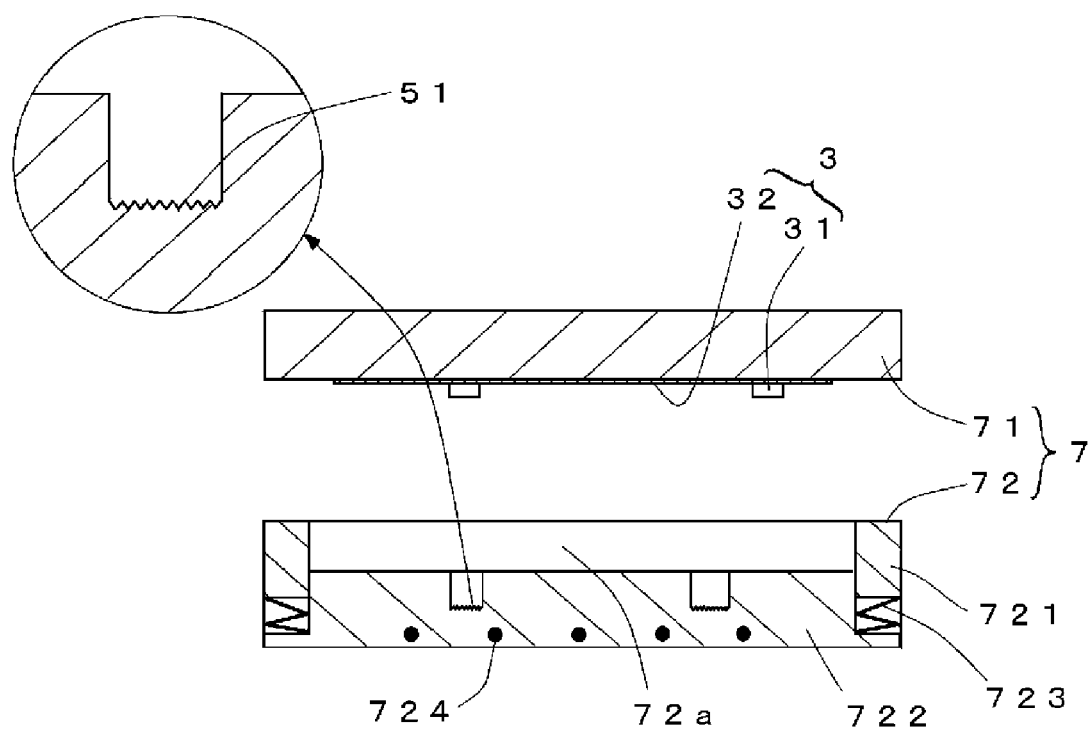
FIG. 29 is a cross-sectional view illustrating an example of a method of forming the fine irregularities in FIG. 28.

As illustrated in FIG. 29, to form the fine irregularities 50 as described above on the front surface of the protrusion 225a of the second molded portion 225, the lower mold 72 of the compression molding mold 7 is configured to have fine irregularities 51 in portions corresponding to the front surfaces of the protrusions 225a of the second molded portion 225.

As described above, in the molding of the second molded portion 225 by the compression molding, while the cavity 72a is compressed, the light-transmitting resin material 10 is filled and solidified. Thus, by the flow of the light-transmitting resin material 10 by compression, the light-transmitting resin material 10 reliably reaches up to the deepest parts of the fine irregularities 51, which are provided on the surface where the cavity 72a is formed of the lower mold 72.

Third Modified Example

In the first embodiment and the second embodiment described above, the case in which, in the manufacturing methods of the illumination display panels, the low-pressure molding molds are the compression molding molds 7 and 70, after the injection of the light-transmitting resin materials 10 made of the uncured thermosetting resins into the cavities 72a and 720a provided with the heated lower molds 72 and 720, the low-pressure molding molds are clamped has been described, but the manufacturing method of the illumination display panel in the present invention is not limited thereto.

For example, in a third modified example, the low-pressure molding mold is an injection press molding mold 9, and after clamping the low-pressure molding mold, a light-transmitting resin material 90 made of a thermoplastic resin in a molten state is injected into a cavity 92a provided with a lower mold 92.

The modified examples of respective steps of the low-pressure molding using the injection press molding mold 9 will be described below.

Figure 30:
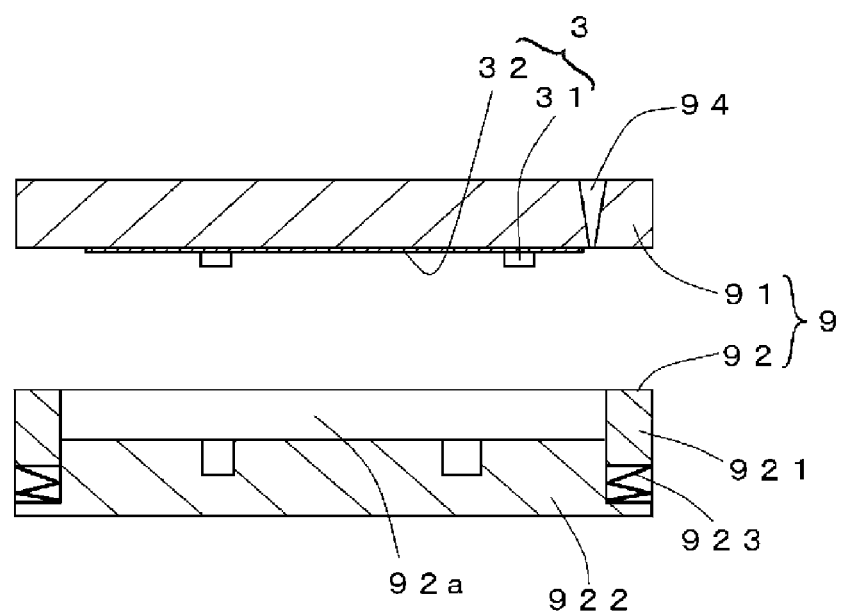
FIG. 30 is a cross-sectional view illustrating an example of low-pressure molding using an injection press molding mold.

FIG. 30 illustrates an upper mold 91 and the lower mold 92 of the injection press molding mold 9 before being clamped. First, the light source mounting substrate 3 is set to the upper mold 91 of the injection press molding mold 9 with the mounted surface of the light sources 31 facing downward (see FIG. 30).

The light source mounting substrate 3 is suctioned by air using, for example, a suction hole and adsorbed to the upper mold 91.

Figure 31:
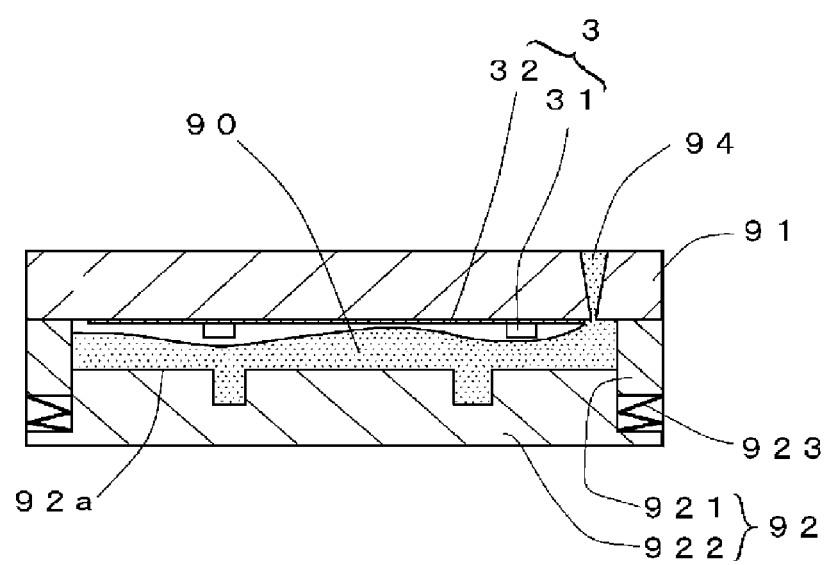
FIG. 31 is a cross-sectional view illustrating an example of low-pressure molding using an injection press molding mold.

Next, after clamping the injection press molding mold 9 to set the cavity 92a in the sealed state, the measured thermoplastic resin in a molten state is injected into the cavity 92a provided with the lower mold 92 of the injection press molding mold 9 as the light-transmitting resin material 90 (see FIG. 31).

FIG. 31 illustrates the lower mold 92 constituted of a cavity block 922 forming the bottom surface of the cavity 92a and a frame block 921 forming a side surface of the cavity 92a. Further, the upper mold 91 provided with an injection port 94 to the cavity 92a is illustrated.

In addition, a spring 923 is provided on a lower portion of the frame block 921. Before clamping the upper mold 91 and the lower mold 92, the frame block 921 is at a raised position by the spring 923.

Examples of the thermoplastic resin used in the injection press molding method. Include a polycarbonate (PC) resin, an ABS resin, and a polymethyl methacrylate (PMMA) resin, or a combination thereof.

Figure 32:
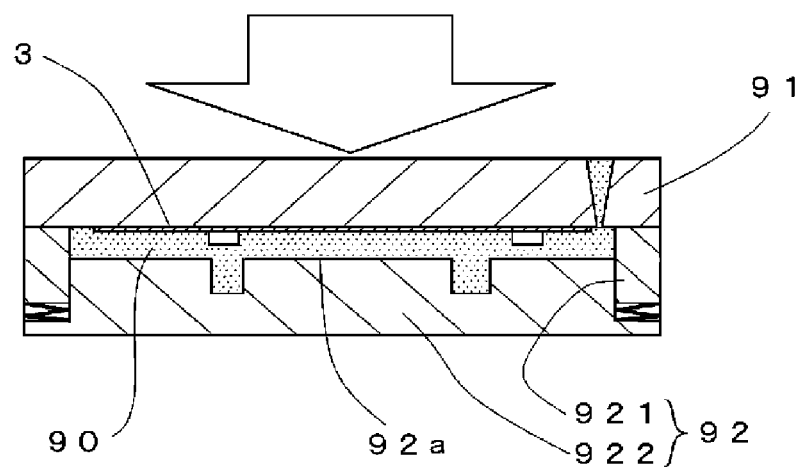
FIG. 32 is a cross-sectional view illustrating an example of low-pressure molding using an injection press molding mold.

Next, after injecting the light-transmitting resin material 90 into the cavity 92a, while the cavity 92a is compressed with the upper mold 91, the light-transmitting resin material 90 is filled and cooled to solidify at low pressure (see FIG. 32).

That is, the frame block 921 of the lower mold 92 is pushed down by the peripheral area of the lower surface of the upper mold 91 to compress the cavity 92a of the lower mold 92 and the light-transmitting resin material 90 injected therein. Thus, the light sources 31 of the light source mounting substrate 3 set to the upper mold 91 are immersed in the light-transmitting resin material 90.

In this state, the light-transmitting resin material 90 in the molten state is cooled to solidify in the cavity 92a of the lower mold 92, and the second molded portion 22 is molded.

Note that, in the compression molding method illustrated in FIG. 32, the case in which the upper mold 91 is lowered with respect to the lower mold 92 to compress the cavity 92a of the lower mold 92 and the light-transmitting resin material 90 injected therein has been described, but the lower mold 92 may be raised with respect to the upper mold 91.

Similarly to the case of the compression molding, the second molded portion 22 thus the injection press-molding has been performed is integrated with the light source mounting substrate 3 so as to seal the light sources 31 with the second molded portion 22 (see FIG. 6).

Note that the injection press-molded second molded portion 22 is made of a thermoplastic resin together with the first molded portion 21. Therefore, the one among the second molded portion 22 and the first molded portion 21 molded first in the manufacturing processes 1, 3, 4, and 6 is configured not to melt to the extent that the shape of the one can no longer be completely maintained during molding of the other molded later. That is, the resin molded first preferably has a softening temperature same as or higher than the heating temperature during the subsequent molding.

Modified Example 4

In the second embodiment described above, the case in which the illumination display panel 100 further includes the decorative sheet 41 as the decorative layer 4 to decorate the front surface of the resin panel 2 has been described, but the illumination display panel in the present invention is not limited thereto.

For example, in the decorative layer 4, a graphic layer may be formed directly on the front surface of the resin panel 2 by, for example, screen printing method.

Additionally, in the second embodiment described above, the case in which the graphic layer is transparent at the display portions 100a of the decorative sheet 41 has been described, but the graphic layer may be formed in a semi-transparent manner at the display portions 100a. The same applies to the case where the graphic layer described above is directly formed on the resin panel 2.

Furthermore, the decorative sheet 41 may include a touch sensor sheet in the layer configuration.

Modified Example 5

Additionally, in the first embodiment and the second embodiment described above, the case in which the resin panel 2 has the shape including the rising portion at the peripheral area has been described, but the illumination display panel in the present invention is not limited thereto.

For example, the shape of the resin panel 2 may be a flat plate shape without a rising portion at the peripheral area. In this case, a housing having a box shape is configured in combination with another molding member. The shape of the resin panel 2 may be other complex shapes.

It should be understood that regarding other configurations, the embodiments disclosed herein are illustrative in all respects, and the scope of the present invention is not limited thereto. Those skilled in the art will readily appreciate that modifications can be appropriately made without departing from the gist of the present invention. Accordingly, other embodiments modified within the scope not departing from the gist of the present invention are obviously included in the scope of the present invention.

INDUSTRIAL APPLICABILITY

The present invention can be used for, for example, vehicles, home appliances, and audio devices.

REFERENCE CHARACTER LIST 1, 100, 103 to 105: Illumination display panel
1a, 100a: Display portion
2, 23 to 25: Resin panel
21: First molded portion (opaque)
211: Through hole
21a: Inner wall surface
21b: Side surface
22, 223 to 225: Second molded portion (light transmission)
22a, 223a to 225a: Protrusion
3: Light source mounting substrate
31: Light source
32: Film substrate
4: Decorative layer
41: Decorative sheet
50, 51: Fine irregularities
7, 70: Compression molding mold
71, 710: Upper mold
72, 720: Lower mold
72a, 720a: Cavity
721, 7210: Frame portion block
722, 7220: Cavity block
723, 7230: Spring
724, 7240: Heater
8: Insert molding mold
81: Male mold
82: Female mold
83: Cavity
84: Injection port
10, 90: Light-transmitting resin material
11: Opaque resin material
13: Integrally molded product
15: Adhesive
80: Injection molding mold
810: Male mold
820: Female mold
830: Cavity
840: Injection port
9: Injection press molding mold
91: Upper mold
92: Lower mold
92a: Cavity
921: Frame portion block
922: Cavity block
923: Spring
94: Injection port

The invention claimed is:

1. An illumination display panel constituting a portion of a housing and including a display portion that is displayable in illumination, the illumination display panel comprising:
a resin panel including a first molded portion and a second molded portion, the first molded portion being present at a portion excluding the display portion, the second molded portion being disposed on a back surface side of the first molded portion, the second molded portion including a protrusion fitted with the first molded portion at a portion where the first molded portion is absent, the second molded portion being made of a light-transmitting resin that transmits light guided to the display portion, the first molded portion being made of an opaque resin having a transmittance of light lower than a transmittance of light of the second molded portion; and
a light source mounting substrate that includes a light source and a film substrate, the light source being disposed on a back surface side of the resin panel, light from the light source being guided to the display portion, the light source being mounted on the film substrate, wherein
at least the light source of the light source mounting substrate is sealed with the second molded portion.

2. The illumination display panel according to claim 1, wherein
a thickness of a light-guiding path portion in the second molded portion is from 0.2 mm to 1.0 mm, and the light-guiding path portion is covered with the first molded portion and guides light to the display portion.

3. The illumination display panel according to claim 1, wherein
the portion where the first molded portion is absent is a through-hole, and the protrusion of the second molded portion is fitted with an inner wall surface of the through-hole.

4. The illumination display panel according to claim 1, wherein the protrusion of the second molded portion is fitted with a side surface of the first molded portion.

5. The illumination display panel according to claim 1, wherein the protrusion of the second molded portion has fine irregularities in a front surface.

6. The illumination display panel according to claim 1, further comprising:
a decorative layer that decorates a front surface of the resin panel.

7. A method of manufacturing an illumination display panel constituting a portion of a housing, the illumination display panel including a resin panel and a light source mounting substrate, the resin panel including a first molded portion and a second molded portion, the first molded portion being present at a portion excluding a display portion displayable in illumination, the second molded portion being disposed on a back surface side of the first molded portion, the second molded portion including a protrusion fitted with the first molded portion at a portion where the first molded portion is absent, the second molded portion being made of a light-transmitting resin that transmits light guided to the display portion, the first molded portion being made of an opaque resin having a transmittance of light lower than a transmittance of light of the second molded portion, the light source mounting substrate including a light source and a film substrate, the light source being disposed on a back surface side of the resin panel, light from the light source being guided to the display portion, the light source being mounted on the film substrate, the method of manufacturing illumination display panel comprising:
setting the light source mounting substrate to an upper mold of a low-pressure molding mold such that a mounted surface of the light source faces downward;
injecting a measured light-transmitting resin material into a cavity provided with a lower mold of the low-pressure molding mold;
after clamping the low-pressure molding mold, filling and solidifying the light-transmitting resin material at a low pressure while compressing the cavity to integrate the second molded portion with the light source mounting substrate such that at least the light source is sealed with the second molded portion simultaneously with molding of the second molded portion; and
integrating the first molded portion with an integrally molded product of the light source mounting substrate and the second molded portion by:
setting the integrally molded product inside an insert molding mold such that the second molded portion side faces a cavity, injecting an opaque resin material made of a thermoplastic resin in a molten state into the cavity, and solidifying the opaque resin material to integrate the first molded portion with the integrally molded product simultaneously with molding of the first molded portion; or
separately molding the first molded portion and then laminating the first molded portion on the integrally molded product.

8. A method of manufacturing illumination display panel constituting a portion of a housing, the illumination display panel including a resin panel and a light source mounting substrate, the resin panel including a first molded portion and a second molded portion, the first molded portion being present at a portion excluding a display portion displayable in illumination, the second molded portion being disposed on a back surface side of the first molded portion, the second molded portion including a protrusion fitted with the first molded portion at a portion where the first molded portion is absent, the second molded portion being made of a light-transmitting resin that transmits light guided to the display portion, the first molded portion being made of an opaque resin having a transmittance of light lower than a transmittance of light of the second molded portion, the light source mounting substrate including a light source and a film substrate, the light source being disposed on a back surface side of the resin panel, light from the light source being guided to the display portion, the light source being mounted on the film substrate, the method of manufacturing illumination display panel comprising:
setting the light source mounting substrate to an upper mold of a low-pressure molding mold such that a mounted surface of the light source faces downward;
setting the separately molded first molded portion in a cavity provided with a lower mold of the low-pressure molding mold;
injecting a measured light-transmitting resin material into the cavity in which the first molded portion is set of the lower mold; and
after clamping the low-pressure molding mold, filling and solidifying the light-transmitting resin material at a low pressure while compressing the cavity to integrate the second molded portion with the light source mounting substrate and the first molded portion such that at least the light source is sealed with the second molded portion simultaneously with molding of the second molded portion.

9. The method according to claim 7, wherein
the low-pressure molding mold is a compression molding mold; and
after injecting the light-transmitting resin material made of an uncured thermosetting resin into the cavity provided with the heated lower mold, the low-pressure molding mold is clamped.

10. The method according to claim 7, wherein
the low-pressure molding mold is an injection press molding mold; and
after clamping the low-pressure molding mold, the light-transmitting resin material made of a thermoplastic resin in a molten state is injected into the cavity provided with the lower mold.

11. The method of manufacturing an illumination display panel according to claim 7, wherein the lower mold of the low-pressure molding mold has fine irregularities in a portion corresponding to a front surface of the protrusion of the second molded portion.

12. The method according to claim 7, further comprising:
setting a decorative sheet for decorating a front surface of the resin panel in the insert molding mold.

13. The method according to claim 7, wherein
the first molded portion is laminated on the integrally molded product, and
the first molded portion used in the lamination is integrated with a decorative sheet for decorating a front surface of the resin panel in advance.

14. The method according to claim 8, wherein the first molded portion used in the low-pressure molding is integrated with a decorative sheet for decorating a front surface of the resin panel in advance.

* * * * *